(12) United States Patent
Sonwalkar

(10) Patent No.: US 11,750,150 B2
(45) Date of Patent: Sep. 5, 2023

(54) METHOD AND APPARATUS FOR INCREASED SOLAR ENERGY CONVERSION

(71) Applicant: SunDensity Inc., Boston, MA (US)

(72) Inventor: Nishikant Sonwalkar, Boston, MA (US)

(73) Assignee: SunDensity Inc., Boston, MA (US)

( * ) Notice: Subject to any disclaimer, the term of this patent is extended or adjusted under 35 U.S.C. 154(b) by 537 days.

(21) Appl. No.: 17/064,773

(22) Filed: Oct. 7, 2020

(65) Prior Publication Data

US 2021/0111668 A1   Apr. 15, 2021

Related U.S. Application Data

(60) Provisional application No. 62/927,228, filed on Oct. 29, 2019, provisional application No. 62/913,315, filed on Oct. 10, 2019.

(51) Int. Cl.
*H02S 40/22* (2014.01)
*G02B 3/08* (2006.01)
*H01L 31/055* (2014.01)

(52) U.S. Cl.
CPC .............. *H02S 40/22* (2014.12); *G02B 3/08* (2013.01); *H01L 31/055* (2013.01)

(58) Field of Classification Search
CPC .............. H01L 31/055; H01L 31/0549; H01L 31/0543; H01L 31/0547; H01L 31/048; H01L 31/0481; H02S 40/22; G02B 3/08
See application file for complete search history.

(56) References Cited

U.S. PATENT DOCUMENTS

| | | | |
|---|---|---|---|
| 4,891,075 A | 1/1990 | Dakubu | |
| 9,954,128 B2 | 4/2018 | King et al. | |
| 2007/0295383 A1 | 12/2007 | Li et al. | |
| 2009/0165842 A1* | 7/2009 | McDonald | F24S 23/30 136/246 |

(Continued)

FOREIGN PATENT DOCUMENTS

| | | | |
|---|---|---|---|
| KR | 1685178 B1 * | 12/2016 | ........... H01L 31/046 |
| WO | WO-2014136031 A1 * | 9/2014 | ......... H01L 31/0543 |
| WO | WO-2020027730 A1 * | 2/2020 | |

OTHER PUBLICATIONS

O'Brien, Paul G., et al.; Selectively transparent and conducting photonic crystal solar spectrum splitters made of alternating sputtered indium-tin oxide and spin-coated silica nanoparticle layers for enhanced photovoltaics; Solar Energy Materials & Solar Cells 102 (2012) 173-183 (Year: 2012).*

(Continued)

*Primary Examiner* — Andrew J Golden
(74) *Attorney, Agent, or Firm* — Louis S. Horvath

(57) ABSTRACT

There is provided an apparatus for solar energy power conversion comprising: a planar array of light concentrators distributed in a pattern; a planar array of PV cells distributed in alignment with the light concentrators; and a spectral converter that extends between the planar array of light concentrators and the planar array of PV cells, wherein the spectral converter is configured to convert incident light of a first spectral distribution from the array of light concentrators to outgoing light of a second spectral distribution for the array of PV cells.

11 Claims, 21 Drawing Sheets

(56) References Cited

U.S. PATENT DOCUMENTS

| | | | |
|---|---|---|---|
| 2009/0277502 A1* | 11/2009 | Yoshida | H01L 31/022425 |
| | | | 136/256 |
| 2010/0013253 A1 | 1/2010 | Winzinger et al. | |
| 2010/0126566 A1 | 5/2010 | Ji | |
| 2010/0288352 A1 | 11/2010 | Ji et al. | |
| 2011/0126889 A1 | 6/2011 | Bourke, Jr. et al. | |
| 2012/0037228 A1 | 2/2012 | Fu | |
| 2012/0080067 A1 | 4/2012 | Tsakalakos et al. | |
| 2013/0052772 A1 | 2/2013 | Surana et al. | |
| 2013/0068300 A1* | 3/2013 | Cornelissen | H01L 31/055 |
| | | | 136/257 |
| 2013/0081693 A1 | 4/2013 | Kaufman | |
| 2016/0133770 A1 | 5/2016 | Meusel et al. | |
| 2019/0067505 A1* | 2/2019 | Ko | H01L 31/043 |

OTHER PUBLICATIONS

Jephias Gwamuri, et. al, "Ambiance-dependent agglomeration and surface-enhanced Raman spectroscopy response of self-assembled silver nanoparticles for plasmonic photovoltaic devices," J. Photon. Energy 7(3), 037002 (Year: 2017).*

Convertino, Annalisa et al.; A New Approach to Organic Solvent Detection: High-Reflectivity Bragg Reflectors Based on a Gold Nanoparticle/Teflon-like Composite Material; Adv. Mater. 2003, 15, No. 13; https://onlinelibrary.wiley.com/doi/epdf/10.1002/adma.200304777 (Year: 2003).*

KR-1685178-B1 English machine translation (Year: 2016).*

Van Dijk et al., "Competition between Extinction and Enhancement in Surface-Enhanced Raman Spectroscopy", Physical Chemistry Letters, American Chemical Society, 2013. pp. 1193-1196.

A. Bouali, S. Haxha, F. Abdelmalek, M. Dridi, and H. Bouchriha, "Tuning of Plasmonic Nanoparticle and Surface Enhanced Wavelength Shifting of a Nanosystem Sensing Using 3-D-FDTD Method", IEEE Journal of Quantum Electronics vol. 50, No. 8 (Aug. 2014), pp. 651-657.

Chen, A., Yuan, Q., and Zhu, K., (2016), "ZnO/a-Si Distributed Bragg Reflectors for Light Trapping in Thin Film Solar Cells from Visible to Infrared Range", App. Surface Science, 360, Part B, pp. 693-697.

Peter Bermel, Chiyan Luo, Lirong Zeng, Lionel C. Kimerling, and John D. Joannopoulos, "Improving thin-film crystalline siliconsolar cell efficiencies with photonic crystals" Dec. 10, 2007 / vol. 15, No. 25 / Optics Express, pp. 16986-17000.

Cameron Stanley, Ahmad Mojiri, and Gary Rosengarten, "Spectral light management for solar energy conversion systems" Nanophotonics (2016), vol. 5, No. 1; pp. 161-179.

J. Walshe, H. Ahmed, S.J. McCormack, J. Doran, "Bragg Enhanced Plasmonic Luminescent Downshifting for PV Devices" EUPVSEC Conference paper, Munich, Germany. Jun. 29, 2016, XPO55765954. URL: https://www.researchgate.net/publication/304579631_BRAGG_ENHANCED_PLASMONIC_LUMINESCENT_DOWNSHIFTING_FOR_PV_DEVICES. 4 pages.

International Search Report and Written Opinion dated Jan. 29, 2021. PCT International application No. PCT/US2020/054586, filed Oct. 7, 2020. 16 pages.

Co-Pending U.S. Appl. No. 17/064,699 "Optical Coating for Spectral Conversion" Notice of Allowance, dated Jan. 7, 2021. Inventor: Sonwalkar.

* cited by examiner

|  | Day1 | Day2 | Day3 | Day4 |
|---|---|---|---|---|
|  | Wh | Wh | Wh | Wh |
| PV Cell | 2.425 | 1.185 | 0.665 | 0.884 |
| PVC Cell | 2.675 | 2.281 | 0.748 | 1.496 |
| PSC cell | 2.761 | 2.983 | 0.949 | 2.295 |
| PVC/PV (%) | 110.3 | 192.6 | 112.5 | 169.2 |
| PSC/PV (%) | 113.9 | 251.8 | 142.7 | 259.5 |

*FIG. 10*

| Front Surface | $P_{in} \left(\frac{mW}{cm^2}\right)$ | $J_{sc} \left(\frac{mA}{cm^2}\right)$ | $V_{oc}$ (V) | FF | η (%) (under AM1.5) | Δη (%) (wrt AM1.5) | η (%) (Si cell under coatings) | Module Power from 96 cells in series (W) |
|---|---|---|---|---|---|---|---|---|
| No Coating (AM1.5 Irrad) | 99.26 | 41.427 | .703 | .803 | 23.5 | --- | --- | 668.2 |
| AR Glass | 75.63 | 39.504 | .701 | .804 | 22.4 | -4.7 | 29.4 | 635.3 |
| Plane Glass | 71.04 | 36.979 | .699 | .805 | 21.0 | -10.6 | 29.3 | 593.1 |
| PSC 3 | 76.34 | 43.624 | .704 | .801 | 24.8 | 5.5 | 32.25 | 704.6 |
| PSC 4 | 86.79 | 47.971 | .707 | .799 | 27.3 | 16.2 | 31.2 | 778.2 |
| PSC 5 | 85.09 | 45.918 | .706 | .800 | 26.1 | 11.1 | 30.5 | 760.7 |

*FIG. 17*

METHOD AND APPARATUS FOR INCREASED SOLAR ENERGY CONVERSION

CROSS REFERENCE TO RELATED APPLICATIONS

This application claims the benefit of U.S. Provisional application U.S. Ser. No. 62/927,228 provisionally filed on 29 Oct. 2019, entitled "METHOD AND APPARATUS FOR INCREASED SOLAR ENERGY CONVERSION", in the name of Nishikant Sonwalkar, incorporated herein in its entirety; and further, this application claims the benefit of U.S. Provisional application U.S. Ser. No. 62/913,315 provisionally filed on 10 Oct. 2019, entitled "OPTICAL COATING FOR SPECTRAL CONVERSION", in the name of Nishikant Sonwalkar, incorporated herein in its entirety.

TECHNICAL FIELD

This invention generally relates to spectral performance of photovoltaic materials and more particularly to photovoltaic apparatus having optical coatings for efficient spectral re-mapping of incident light energy.

BACKGROUND ART

It is widely acknowledged that even incremental improvements that make solar energy harvesting more efficient can have significant economic and environmental impact. Among areas of particular interest is the development of improved materials for converting solar energy to a more useful form.

Each type of light-propagating optical material has a characteristic spectral response to light energy that can vary over a band of wavelengths. Conventional optical glass types, for example, exhibit optimum transmission over a given range, but can show less efficient transmission at particular wavelengths. Optical coatings of various types have variable response and efficiencies at particular wavelength ranges. Photonic sensors and energy converters, such as photovoltaic (PV) solar energy converters, can be much more efficient over some wavelength bands than at others.

Photonic conversion methods have been proposed and used for compensating and adjusting spectral response for different types of optical components and materials. Methods for up-conversion (UC), down-conversion (DC), and other types of spectral response modification have been developed for altering the inherent response of particular light-propagating optical materials in the hope of achieving measurable and useful performance improvements.

While some headway has been made in improving the efficiency of energy generation in the PV solar energy field, appreciable problems remain. Among limitations faced in improving spectral response for PV applications in particular, and for light-propagating materials in general, are problems related to the materials used to fabricate components that provide UC or DC functions. Earlier attempts to improve the efficiency of photovoltaics, for example, have been characterized by costly and/or environmentally unfavorable materials. Lanthanides and rare-earth materials have been particularly noted as candidates for improving spectral response for light-propagating optical materials. However, these materials must be carefully handled in order to achieve results that justify expense, fabrication, and potential waste disposal difficulties. Quantum-dot materials are subject to the same problems and introduce a number of environmental safety concerns that can hinder their application with photovoltaics.

In addition to materials-related limitations, there are also known practical principles for energy conversion that have been widely accepted by those skilled in the optical materials arts, including principles related to heat generation and other practical limitations.

Thus, it can be appreciated that there is room for improvement for methods related to improved spectral performance and engineering of light-propagating optical materials.

SUMMARY OF INVENTION

It is an object of the present disclosure to advance the art of solar energy harvesting by providing materials having improved spectral response and efficiency. With this object in mind, the present disclosure provides an apparatus for solar energy power conversion comprising:
  a planar array of light concentrators distributed in a pattern that is replicated over the array;
  a planar array of photovoltaic (PV) cells distributed in alignment with the light concentrators; and
  a spectral converter that extends between the planar array of light concentrators and the planar array of PV cells, wherein the spectral converter is configured to convert incident light of a first spectral distribution from the array of light concentrators to outgoing light of a second spectral distribution for the array of PV cells.

An advantage provided by apparatus and methods of the present disclosure is the capability to formulate and use materials that are much less environmentally objectionable than those proposed for spectral efficiency improvement.

Other desirable objectives, features, and advantages of the disclosed invention may occur or become apparent to those skilled in the art. The invention is defined by any appended claims.

INDUSTRIAL APPLICABILITY

According to a broad aspect of the present disclosure, apparatus and methods are provided for achieving improved spectral response of photovoltaic devices for solar energy generation and associated light-propagating optical materials.

BRIEF DESCRIPTION OF DRAWINGS

FIG. 10 is a table showing comparative energy generation for different arrangements, with and without optical concentrator and bandpass filter.

FIG. 17 is a chart showing exemplary data for various coatings used for spectral conversion, according to an embodiment of the present disclosure.

DESCRIPTION OF EMBODIMENTS

Figure 1:
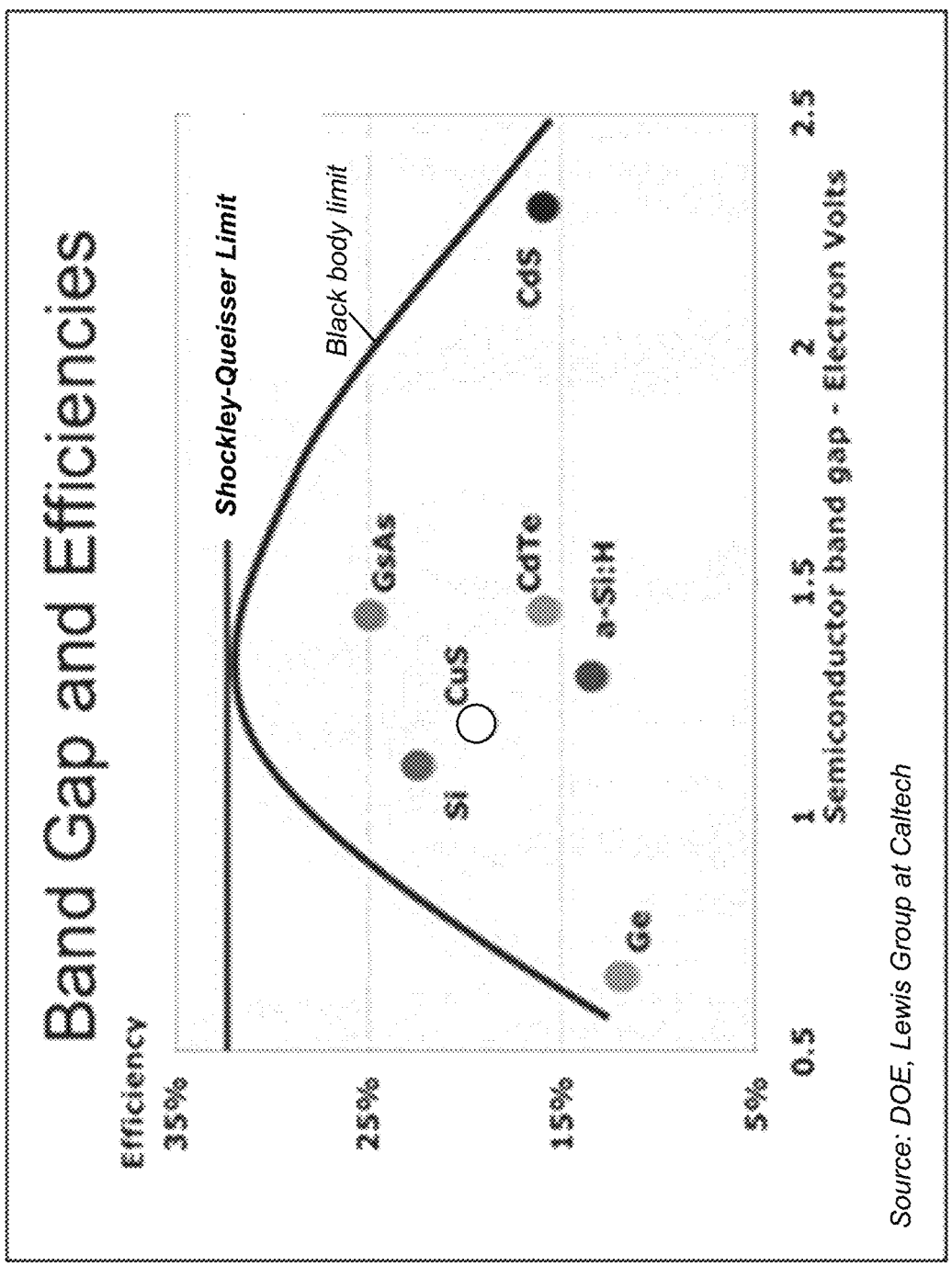
FIG. 1 is graph visually relating semiconductor band gap efficiencies to electron volt values.

Figures shown and described herein illustrate key principles of operation and fabrication for an optical apparatus according to various embodiments and are not drawn with intent to show actual size or scale. Some visual exaggeration may be necessary in order to emphasize basic structural relationships or principles of operation.

In the context of the present disclosure, terms "top" and "bottom" or "above" and "below" are relative and do not indicate any necessary orientation of a component or surface, but are used simply to refer to and distinguish opposite surfaces or different light paths within a component or block of material. Similarly, terms "horizontal" and "vertical" may be used relative to the figures, to describe the relative orthogonal relationship of components or light in different planes, for example, but do not indicate any required orientation of components with respect to true horizontal and vertical orientation.

Where they are used, the terms "first", "second", "third", and so on, do not necessarily denote any ordinal or priority relation, but are used for more clearly distinguishing one element or time interval from another. For example, there are no fixed "first" or "second" elements in what is taught herein; these descriptors are merely used to clearly distinguish one element from another similar element in the context of the present disclosure.

In the context of the present disclosure, the term "film" can be used to mean a coating that is applied to a substrate as one or more thin layers, such as a thin-film optical coating formed from successively formed layers of materials treated to have different indices of refraction. A film can also be a sheet of a light-propagating substrate formed of one or more layers of optical materials and used in standalone fashion or optically coupled to another optical component, such as using an adhesive.

As used herein, the term "energizable" relates to a device or set of components that perform an indicated function upon receiving power and, optionally, upon receiving an enabling signal. A "light-propagating" material transmits or conveys the bulk of the light, at least more than 50%, received by the material. The range of interest for light propagation for PV conversion is generally between about 200 nm and 2200 nm.

The term "nanoparticle" generally refers to particles that have an intermediate size between individual atoms and macroscopic bulk solids, with an average diameter between about 1 nm to 100 nm. Nanoparticle size for a material is typically on the order of the Bohr exciton radius, or the de Broglie wavelength of the material, which may allow individual nanoparticles to trap individual or discrete numbers of charge carriers, either electrons or holes, or excitons, within the particle. The spatial confinement of electrons (or holes) by nanoparticles is believed to alter the physical, optical, electronic, catalytic, optoelectronic and magnetic properties of the material.

Energy output of a PV device or system is proportional to the level of absorption of light photons of the proper energy bands. Improved absorption of energy-generating wavelengths can increase the efficiency of solar energy generation by an appreciable amount, resulting in lowered energy costs, with related advantages for retrofit and rebuild of earlier PV equipment now being used.

Solar Cell Function and Efficiencies

In order to better understand the nature and scope of solutions provided by the present disclosure, it is instructive to review the basic operation of typical solar cells in a PV device. A typical solar cell is a silicon p-n junction diode having a depletion region. In the absence of light, the cell behaves in similar fashion to a diode. When light is incident on the cell, the photons are absorbed by the silicon. This added energy excites silicon electrons, causing transition from the valence band to the conduction band, wherein the electrons are free to move. These excited electrons are called "free carriers". The electron transition creates a corresponding vacancy called a "hole". A potential is created across the depletion region as a result of recombination to form neutral atoms there. Metal contacts connected to the p and n regions give these electrons a flow path, an external circuit. The electrons can move according to this potential and recombine with the holes. This motion of electrons gives rise to an electric current, so that the silicon cell acts as a battery.

Among inherent limitations of existing PV cells are thermodynamic constraints, including Shockley-Queisser (S-Q) limits. From a thermodynamic perspective, it can be assumed that both the sun and solar cell are "black bodies" with full solar energy incident on the cell surface at a normal angle. Carnot work is assumed to be extracted from the cell by a heat engine. For the sun's temperature at 5760 k and ambient temperature of 300 k, a maximum of 85% efficiency can be obtained at cell temperature of 2470 k. At this limit, all photons are considered to be absorbed; there is no thermal dissipation and maximum work is extracted from each photon.

The S-Q limit models the semiconductor cell as one material with a single p-n junction. It is assumed that all incident photons having energy higher than the band gap produce one electron-hole pair, per photon. All excess energy of the photon is converted to heat. The S-Q limit is based on the assumption that one sun of unconcentrated solar radiation is incident on a PV cell. The incident photon flux density is very low and can be increased up to about 500× using inexpensive optics.

For a semiconductor electron to move into an external load circuit, its energy level must be increased from its normal valence level to its higher energy conduction level. The amount of energy needed for a boost to the higher level is called the "band gap" energy. All photons having energy higher than the band gap energy can produce a carrier electron which produces electrical current. However, only the energy amount equal to band gap energy is used to excite the electron, the rest of the excess is converted to heat. Heating of the cell increases the dark current and decreases the overall output of the cell. Therefore, if the photons are close to the band-gap of the p-n junction of a photovoltaic solar cell, most of the photons get absorbed and the rest should be reflected as they do not contribute to the generation of electron-hole pair but heat the solar cell, causing increase in the dark-current.

Concentrated photovoltaics (CPVs) face the problem of efficiency decrease caused by the increase in the temperature of p-n junction, which leads to higher dark current, causing recombination of electrons and holes and reducing the charge in the conduction band.

In the proposed embodiment for photonic solar conversion, only photons close to the energy of band-gap of the irradiated p-n junction are allowed to reach solar cells, using an optical coating. Once the photons not absorbed at the band-gap of p-n junction (that is, photons that would otherwise cause heating of solar cells) are eliminated using an optical coating, the concentrated solar radiation can then linearly increase power generation with a corresponding increase in photon density.

The use of optical coatings for improving the energy output of PV cells is described, for example, in the following disclosures:

US Patent Application Publication No. 2008/0171191 A1 by Gadomsky describes the use of nano-structured antireflective optical coatings. However, existing embodiments of photonic solar conversion use nano-optical coatings only as band-pass filters.

US Patent Application Publication No. 2009/0084963 A1 by Kost describes apparatus and method for enhanced down conversion of photons with numerous layers to trap photons but does not use a nano-optical coating or optical concentrator.

WO Patent Application Publication No. 2015/138990 A1 by Songo Jin et. al describes solar energy absorbent coatings and methods of fabrication for coatings that absorb the solar spectrum over one wavelength region and reflect solar energy over another portion of the spectrum. Power output, however, is disappointing.

US Patent Application Publication No. 2006/0169971 A1 by Cho et al. describes an energy conversion film and quantum dot film that helps convert high energy solar radiation to lower energy solar radiation using various quantum dot sizes to enhance solar energy conversion.

Various optical geometries for higher concentration of solar radiation in photovoltaic cells nave been proposed, but fail to sustain higher efficiencies. In large part, this shortcoming is due to increased temperature of the solar cells under concentrated solar radiation. In an embodiment of the present disclosure, heating of the solar cell is greatly reduced or eliminated due to an optical coating that allows only photons with energy close to the band-gap to be incident on the solar cells, eliminating most of the photons of higher energy that cause heating.

Significant industry research to-date has focused on improving the efficiency of silicon-based solar cells while increasing efficiency and reducing costs. Little attention, however, has been paid to the conditioning of the solar spectrum falling on the PN junction, which is the basis for electric power generation. In the proposed innovation, the focus is on the photons that reach the band-gap of the solar cells for maximum absorption. By proper selection and distribution of light energy, the light photons can be conditioned to match the band gap of photovoltaic solar cells. This approach proves to be more promising than creating multi junction solar cells, an approach that can become cost-prohibitive due to expensive band-gap engineering, e.g. tandem solar cells.

FIG. 1 shows efficiency limitations vs. semiconductor band gap for black body conditions, with the S-Q (Shockley-Queisser) limit set for one electron-hole pair per photon for a number of types of solar cell materials. Excess photons are lost to heat and other effects. It has been found that about 47% of the incident energy is lost as heat; 18% of the energy is not converted and passes through the solar cell; 2% of the energy is lost in recombination effects. At best, the remaining 33% can be converted into electricity. The theoretical S-Q limit of a Silicon solar cell is thus 33%. Not considered in the above efficiency calculations are losses due to optical arrangements and manufacturing defects.

Although some success has been shown using lanthanide elements and quantum dots, however, these materials are still fairly expensive and not acceptable for broad commercial use without significant environmental concerns. In response to the need for improved materials and results, the Applicant has found that a particular arrangement that combines nano-particles suitably structured and embedded in metal oxides can achieve a band-pass of 700 to 1100 nm and a low percentage of the down-shifting of the solar photons of 300 nm to 600 nm wavelength towards 800 nm to 900 nm low energy photons. Transmittance and reflectance spectra for the experimental coating has been validated by independent testing. Outdoor testing indicates a gain of efficiency for a 72-cell full size panel, with overall improvement averaging from 15% to 22% in solar panel efficiency based on outdoor field trials.

According to an embodiment of the present disclosure, a photonic solar conversion (PSC) process using an engineered nano-optical coating, as described in more detail subsequently, can down-convert high energy photons, having wavelengths that include ultraviolet (UV) wavelengths and a portion of visible light, to lower-energy light that is more closely tuned to the bandgap of c-Si cells. Down-conversion of this type, conditioning the light energy to more suitable levels for energy conversion, is capable of increasing the external quantum efficiency (EQE) of the photonic cells. A coating formed using down-conversion according to the Applicant's process can improve efficiency of a conventional, lower-cost solar panel by from 15% to 22%. In a broader aspect, embodiments of the present disclosure can be used to provide wavelength shifting of incident light, including down-conversion, up-conversion, and bandgap narrowing, for example.

Figure 2:
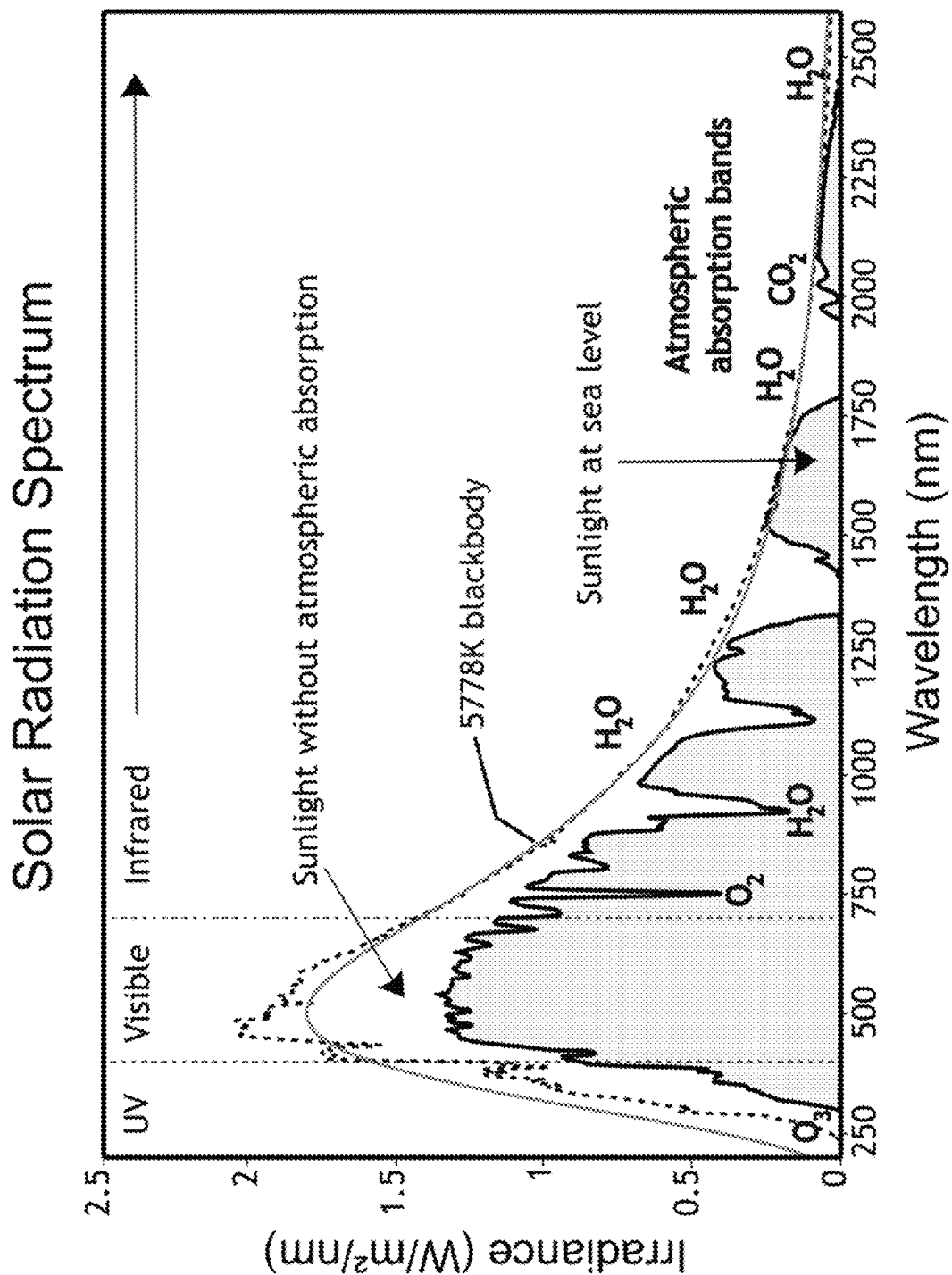
FIG. 2 is a graph showing the spectral distribution of solar energy.

As is shown in the graph of the solar radiation spectrum in FIG. 2, solar energy has wavelengths ranging from about 300 to 2400 nm. The wavelengths that are most useful for solar energy PV conversion, using a bandgap at 1064 nm, lie in the range between about 400-1200 nm.

Figure 3:
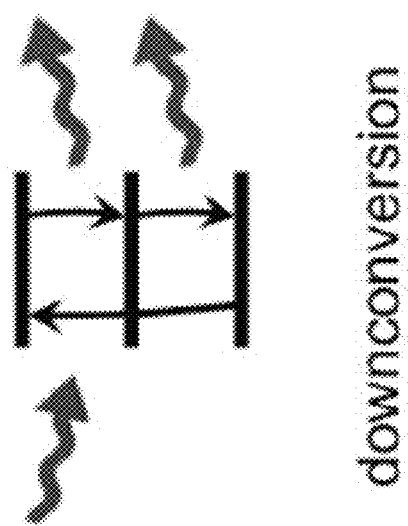
FIG. 3 is a simplified schematic showing down conversion.

FIG. 3 shows, in simplified schematic form, the mechanism of spectral down-conversion, in which a high energy photon is converted to two lower energy photons. Conventional solutions for providing spectral conversion of this type in a light-propagating material rely heavily on lanthanide materials.

As one conventional practice, management of the solar spectrum for conditioning light and performing a measure of down-conversion using a photoluminescent down-conversion layer (PDL) with quantum dots and lanthanide ions is known. In principle, as is shown schematically in the simplified diagram of FIG. 3, down-conversion takes place because of the resonant transfer of one high energy photon to generate two or more lower energy photons, causing a gain of more than 100% in external quantum efficiency (EQE).

For example, in a lanthanide ion layer which has praseodymium Pr3+ in yttrium fluoride YF3 host, a photon with high energy at 185 nm wavelength (approx. 6700 meV) is first absorbed in the Lanthanide ion, then down-converted into two low energy photons of 408 nm and 620 nm (approx. 3040-2000 meV). The process is achieved in two steps; initially:

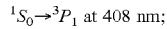

$^1S_0 \to {}^3P_1$ at 408 nm;

then, the second conversion $^3P_1 \to {}^3F_2$ at 620 nm.

The process of down-shifting high energy photons to numerous low energy photons increases the probability that more than one electron will be generated per photon, thus increasing external quantum efficiency.

The uses and advantages of lanthanide elements, used in conventional approaches for energy down-conversion, are well-understood. The availability of electrons in various states that is characteristic of the lanthanides makes these substances readily usable for down-conversion applications. Other elements, meanwhile, do not enjoy this inherent advantage and would not be considered as likely candidate materials for fabricating a down-conversion article.

Lanthanide materials, however, present a number of problems in cost, availability, handling, and introduce a number of environmental concerns. Lanthanides also show considerable losses that constrain how much improvement can be obtained.

Photonic Solar Conversion

The Applicant's approach for improved efficiency of photovoltaics and for other applications in which spectral conditioning has value does not depend on lanthanides or phosphor-based light generation in order to shift the wavelength of light for improved efficiency in solar energy conversion. Instead, the Applicant has identified a novel sequence for light handling and energy conversion, along with a corresponding layered structure that can be engineered to provide the down-conversion that is most useful for photovoltaic and other applications. The Applicant's technique applies quantum matching to the problem of wavelength shifting, forming a multilayered structure that takes advantage of both properties of Bragg reflection and efficiencies of surface enhanced Raman scattering.

Significantly, embodiments of the present disclosure can be used to improve the performance of solar panels that have already been installed. The Applicant combines a number of innovations in order to boost the power output of existing solar panels, including the following:

(i) Photon spectral conditioning. Conversion of solar radiation to coherent light energy at wavelengths close to the band-gap energy of the PV cell.

(ii) Nano-optical coating that acts as a band-pass filter and spectral converter, transmitting photons with energy levels (wavelengths) close to the band-gap energy of the PV cell. According to an embodiment, a spectral converter created by the application of a group of metal oxide coatings is used to convert radiation from incident sunlight into a band pass of 100 nm around the optimum wavelength close to 800 nm peak. Once the filter/spectral converter layer is applied above the photovoltaic panel, a concentrator is used to increase the intensity of solar radiation to 5× to 15× suns per unit area, increasing the density of incoming photons having a near optimum wavelength.

(iii) Increased photon density using at least one method of concentration, such as a concentrator focused on the PV cells. According to an embodiment, a honeycomb of Fresnel lenses coated with the band-pass filter for optimum wavelength is designed to achieve a 5× increase in the power output of the solar cell.

The target wavelengths for optimizing performance can be determined by measuring the frequency response of given semiconductor solar cells with variable wavelength solid-state lasers. Laser output can be varied over a range, such as increased from 600 nm to 1100 nm, while measuring the output and efficiency at incremental points over the range. Response curves can be plotted accordingly.

Figure 4:
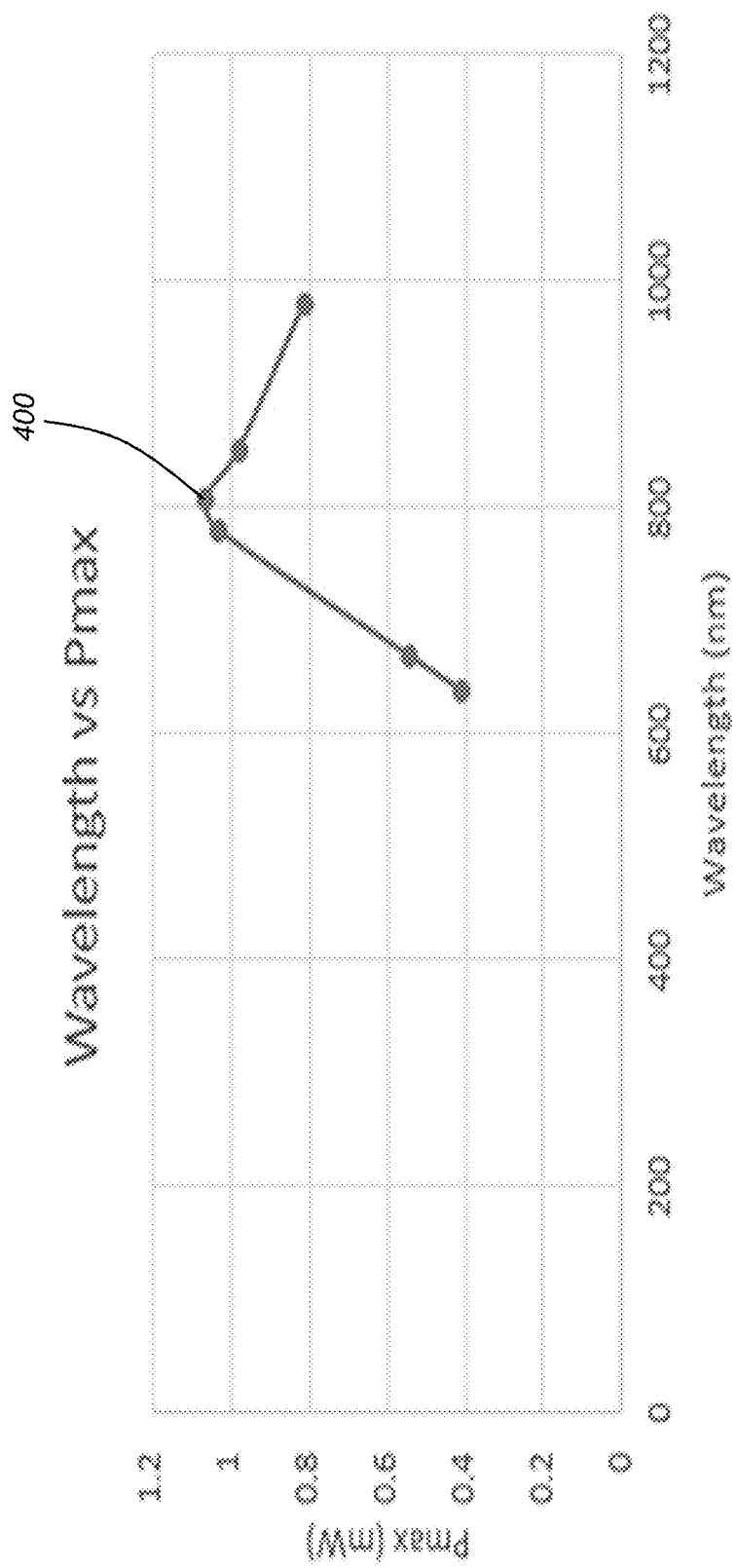
FIG. 4 shows power generated by polysilicon p-n junctions for incident laser light over a range of wavelengths.

By way of example, the graph of FIG. 4 shows power generated by polysilicon p-n junctions for incident laser light over a range of wavelengths. An optimum value 400 is at the peak output near 800 nm.

Figure 5:
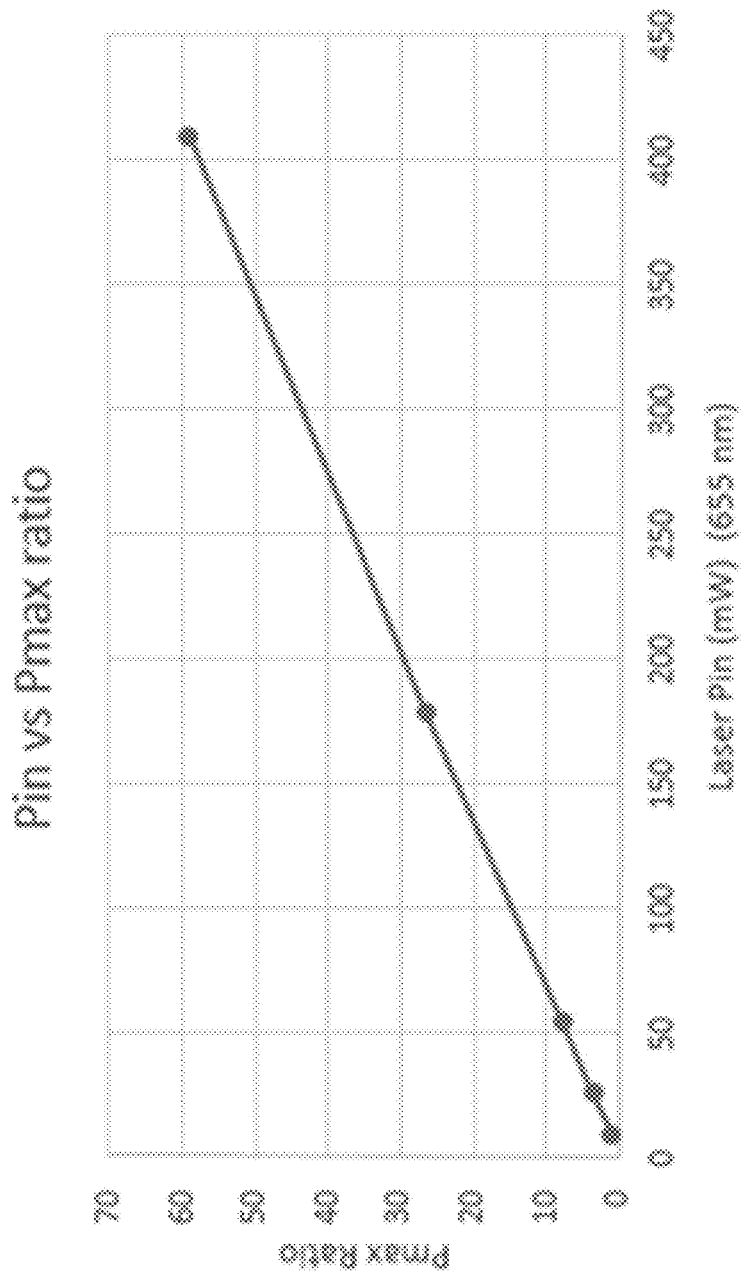
FIG. 5 is a graph showing experimental observations, with power output increase as a result of increase in the photon density at a coherent wavelength.

The graph of FIG. 5 shows experimental observations, with current output increase as a result of increase in the photon density at a coherent wavelength. As shown in FIG. 5, the increase in intensity of the coherent photon at the optimum wavelength laser beam incident on solar cell linearly increases the power generation.

The optical filter provided to direct light of the optimum wavelength for the p-n junction is used to block all other photons not useful for generation of electrical energy in the PV panel.

As shown in FIG. 5, the x-axis represents power input of the solid-state laser with photons with desired wavelengths irradiating the target p-n junction as Pin power input. The y-axis represents the maximum power output Pmax. The power output increases linearly with the increase in the power input. This indicates that the photons close to band-gap energy (matching energy) of the solar cell correspondingly increase the efficiency of photonic conversion to electricity. With power generation increase linear with photon intensity increase, photon conversion to suitable power levels.

Embodiments of the present disclosure increase power generation using a combination of an optical concentrator and a spectral conversion optical coating on a PV panel substrate.

Solar Panel Arrangement

Figure 6:
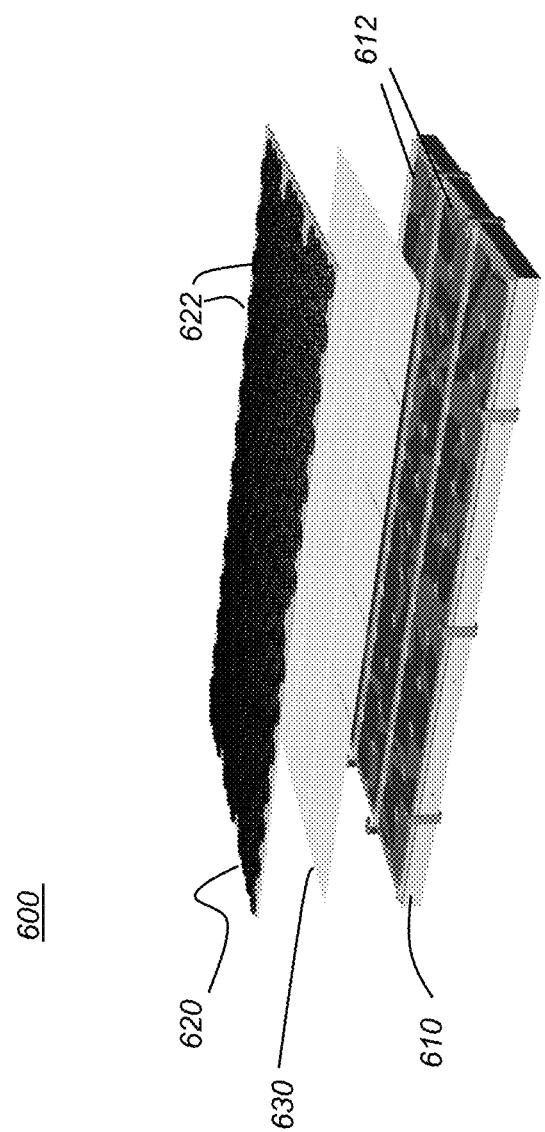
FIG. 6 shows an exploded view of a solar panel according to an embodiment of the present disclosure.

FIG. 6 shows an exploded view of a solar panel 600 formed according to an embodiment of the present disclosure. A layer of light concentrators 620 has an array of lens elements 622, such as an array of adjacent Fresnel lenses, for concentrating light and directing the concentrated light along light paths toward PV cells 612 arrayed on a PV array 610. A band pass filter/spectral conditioner 630 is disposed in position in the light path for conditioning the light that is conveyed between the light concentrator and PV arrays; the spectral conditioner 630 can be formed on or within a layer of glass or other optically transparent material having an optical coating. According to an alternate embodiment, the relative positions of the array 620 of light concentrators and spectral conditioner 630 can be reversed from that shown in FIG. 6, so that filtering and spectral conversion of the incident sunlight precedes concentration of the light in the light path.

Figure 7:
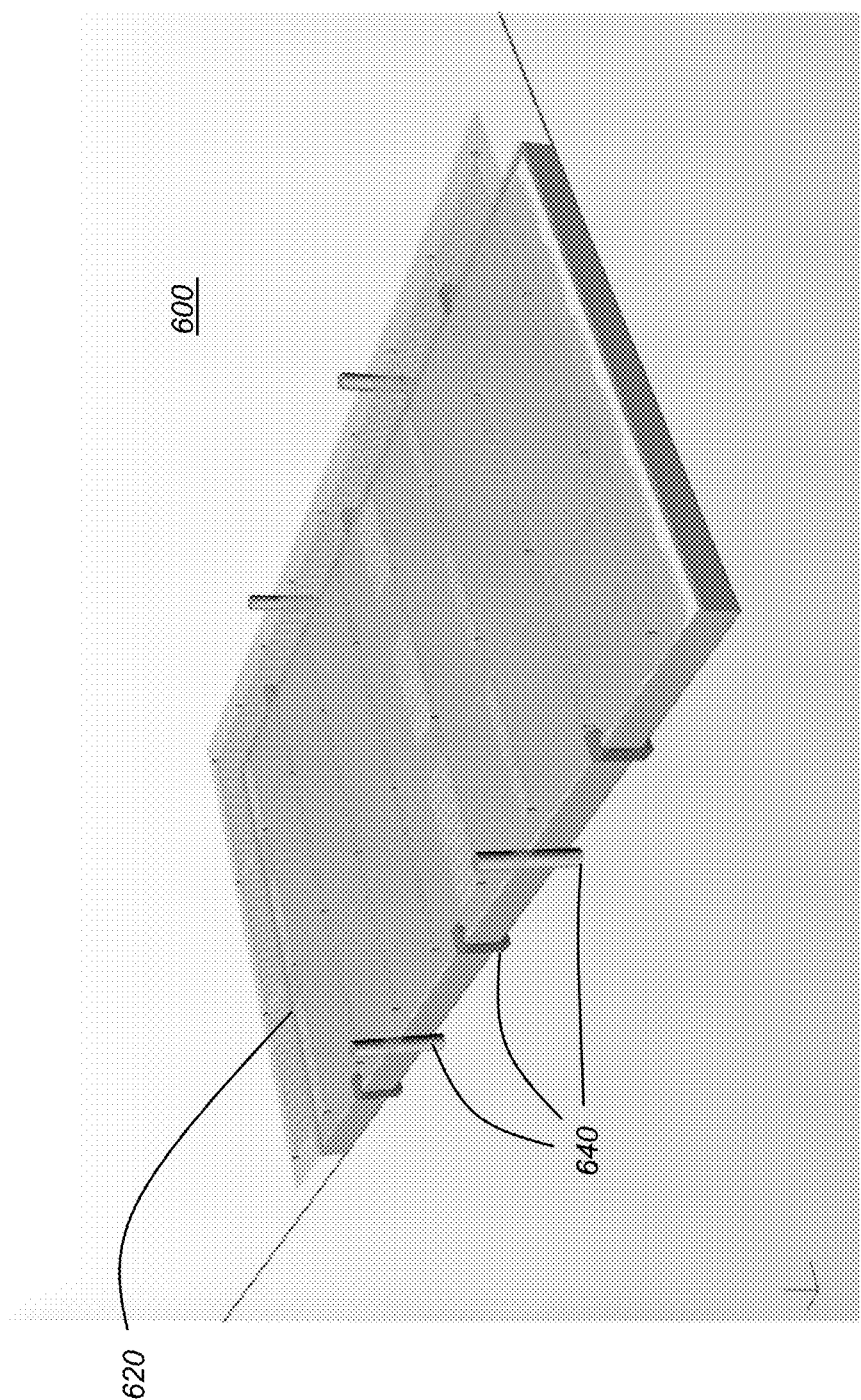
FIG. 7 is a perspective view of an assembled solar panel.

FIG. 7 shows solar panel 600 as assembled, according to an embodiment, using various types of clamps, brackets, or other fasteners 640 to hold array 610, filter/spectral conditioner 630, and concentrators 620 together in place, as a single unit. According to an embodiment of the present disclosure, distance between adjacent parallel planes that correspond to facing surfaces of the layered components is less than 20 mm. This distance can be varied to suit the particular arrangement of optical concentrators, for example, or for improved performance of PV or light-conditioning components.

According to an embodiment of the present disclosure, the spacing between components 610, 620, and 630 can be adjustable.

Figure 8:
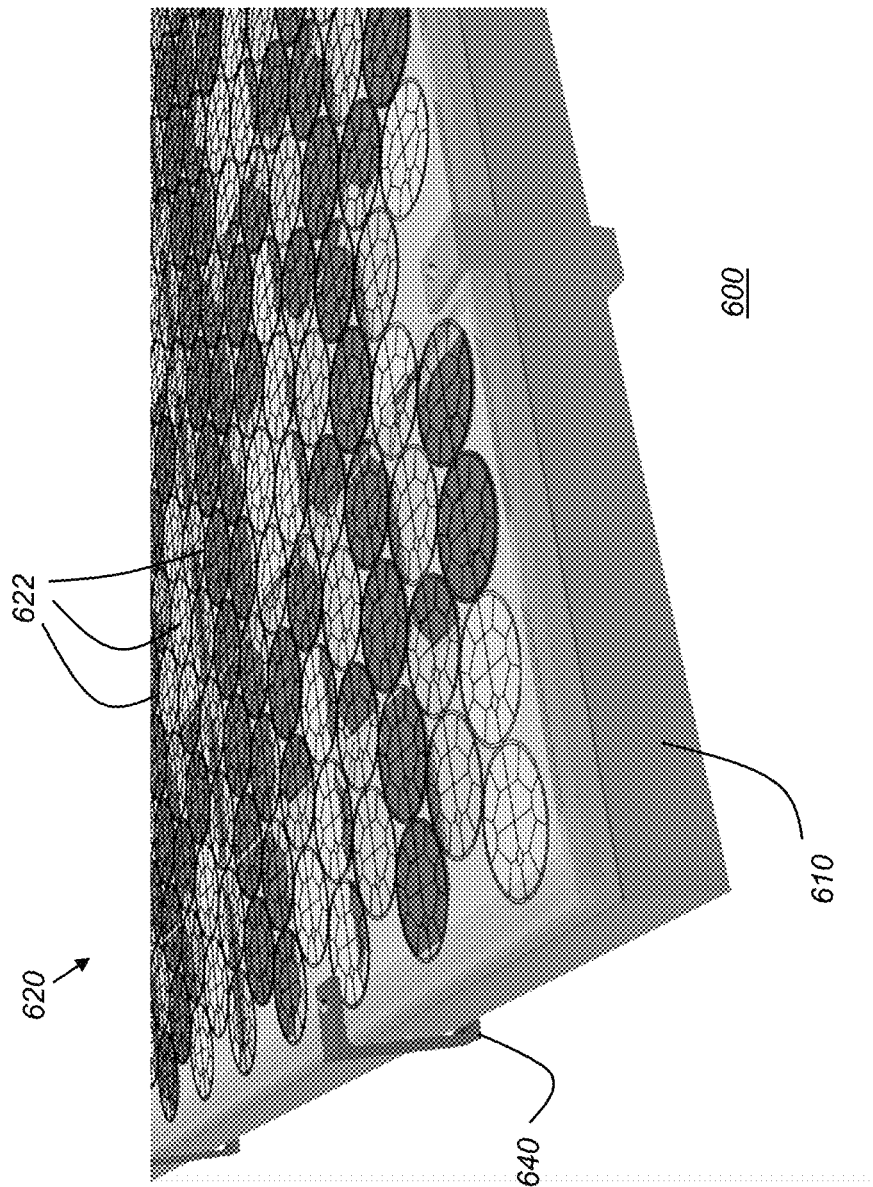
FIG. 8 is an enlarged view showing a corner of an assembled solar panel.

FIG. 8 is a close-up view that shows a corner portion of solar panel 600 as assembled.

Retrofit Applications

For retrofit to existing solar panels having an array of PV devices, an embodiment of the present disclosure provides a suitable layer of light concentrators 620 and band pass filter/spectral conditioner 630. Using a modular approach, the layer of light concentrators 620 and band pass filter/spectral conditioner 630 can be designed, scaled, and framed to suit the dimensions and the array geometry of the solar panel.

Light Concentrators 620

To increase the number of photons passing through the nano-optical coating or enabled photonic bandpass filter layer, a host layer of optical concentrators, such as an array of Fresnel lens concentrators (having a honey-comb arrangement) can be layered on top of the photonic band pass filter. A device using a combination of low concentration optics (3×-5×) with a band pass filter and coherence enhancement nano coating, can provide significant increase in energy generation from conventional photovoltaic panels.

Planar light concentrator arrays are most advantageous for compact packaging. Various types of light concentrators can be used, in addition to Fresnel lens elements. For example, planar light concentrators can include holographic lens arrays and GRIN (gradient index) lens arrays, for example.

The light concentrators 620 and PV cells are aligned and arranged to optimize the energy collection that is provided for photovoltaic conversion. The spectral conditioner 630 can be provided in array form or as a continuous sheet or coating, for example.

Light-Handling for Band-Pass Filter/Spectral Conditioner 630

The optics industry has used coatings of various types, applied onto a transparent medium, for selective transmission and reflection of the solar radiation. Chemical vapor deposition (CVD) and physical vapor depositions (PVD) are mature techniques that have been adapted to form band-pass filters for restricting the wavelengths of light passing through the transparent medium. The Applicant has developed a proprietary nanoparticle-based optical coating that aligns the wavelength distribution of solar radiated photons to more closely correspond to the band gap of mono crystal silicon solar cells while enhancing the coherence of the photons using the band pass filter/spectral converter 630 formed on the substrate, such as provided using a coating.

To accomplish photonic solar conversion, a thin film optical filter technology has been configured to restrict transmission of solar radiation within a given band-pass. Photons received by the p-n junction solar cells (e.g. by the Si solar cells) have an electromagnetic radiation energy level. The spectral response to absorption of the solar cells increases linearly as the wavelength of the incident light comes closer to the bandgap. Hence, two effects are desirable: 1) to constrain the wavelengths so that they are close to the bandgap; and 2) to create an abundance of photons having wavelengths that are sufficiently close to the bandgap of the p-n junction in order to optimize absorption.

Solar radiation has wide range of wavelengths as shown in FIG. 2, ranging from 300 nm to 2400 nm. The region of interests for solar energy photovoltaic conversion for Si solar cells with band-gap at 1064 nm is in the region between about 400 nm (visible) and 1200 nm (infrared). Solar radiation above the band gap passes through the band gap and is not useful for photovoltaic conversion.

In order to condition the solar radiation for increased efficiency, the Applicant has developed a band pass filter/light conditioner 630 as a thin film optical filter, formed using chemical vapor deposition or other suitable deposition method, that conditions the solar radiation to shift toward wavelengths from 800 nm to 1100 nm. This band pass filter is formed using a combination of metal oxides e.g. $SiO_2$ and $TiO_2$. These oxides are used to generate a proprietary mix of nano-particles. For example, divalent manganese and trivalent chromium fluoresce at wavelengths close to the p-n junction bandgap of 1064 nm. This proprietary thin coating provides the necessary conditioning of photons for more suitable wavelengths in this range. A filter layer formed in this manner can be applied onto a glass substrate, in the path of light to the array of photovoltaic cells. An optical concentrator can then be used to increase the concentration of photon density to up to 10 to 100 suns per unit area.

Figure 9:
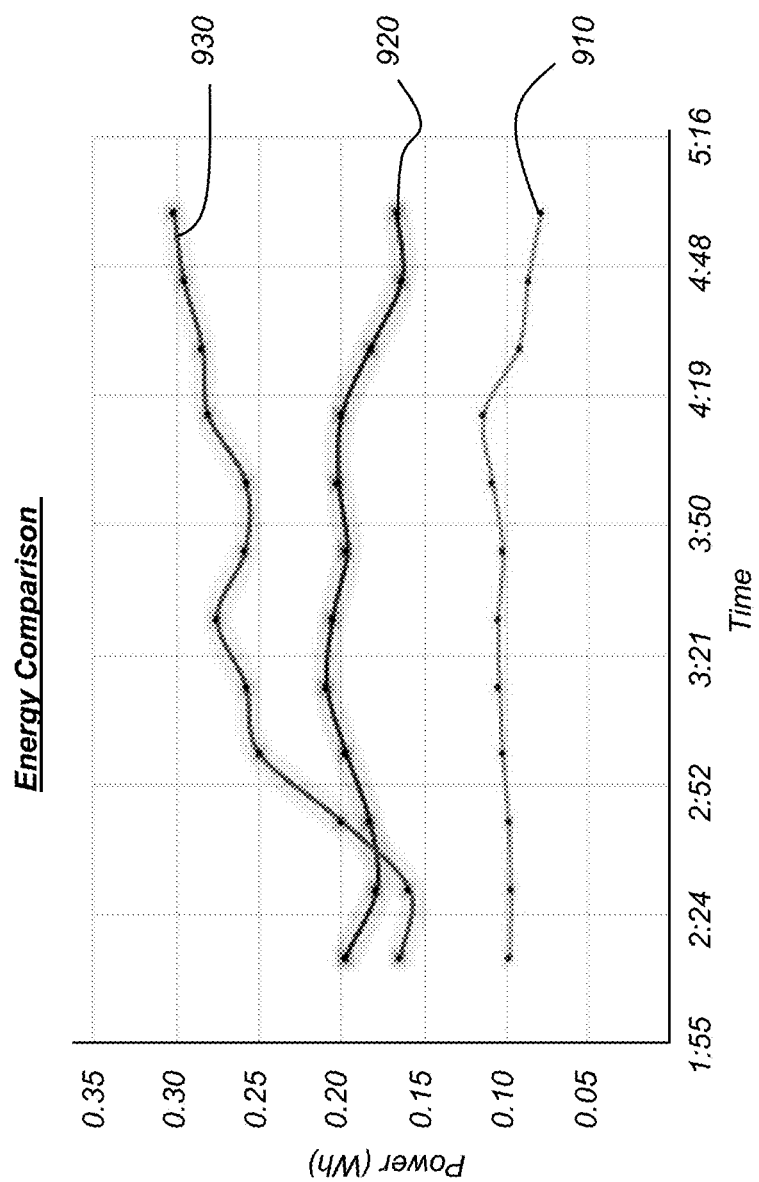
FIG. 9 is a graph that compares energy levels with and without optical concentrator and bandpass filter.

The graph of FIG. 9 shows a comparison of energy levels obtained using three different component arrangements: bare-cell PV output 910, PV generation with an added lens or other optical concentrator as output 920, and PSC generation 930 using an added band pass filter as output, according to an embodiment of the present disclosure. The table in FIG. 10 shows representative energy values for the PV, PVC, and PSC cases in measurements (Watt-hrs.) taken over a four-day period.

Band Pass Filter/Light Conditioner Configuration

Figure 11:
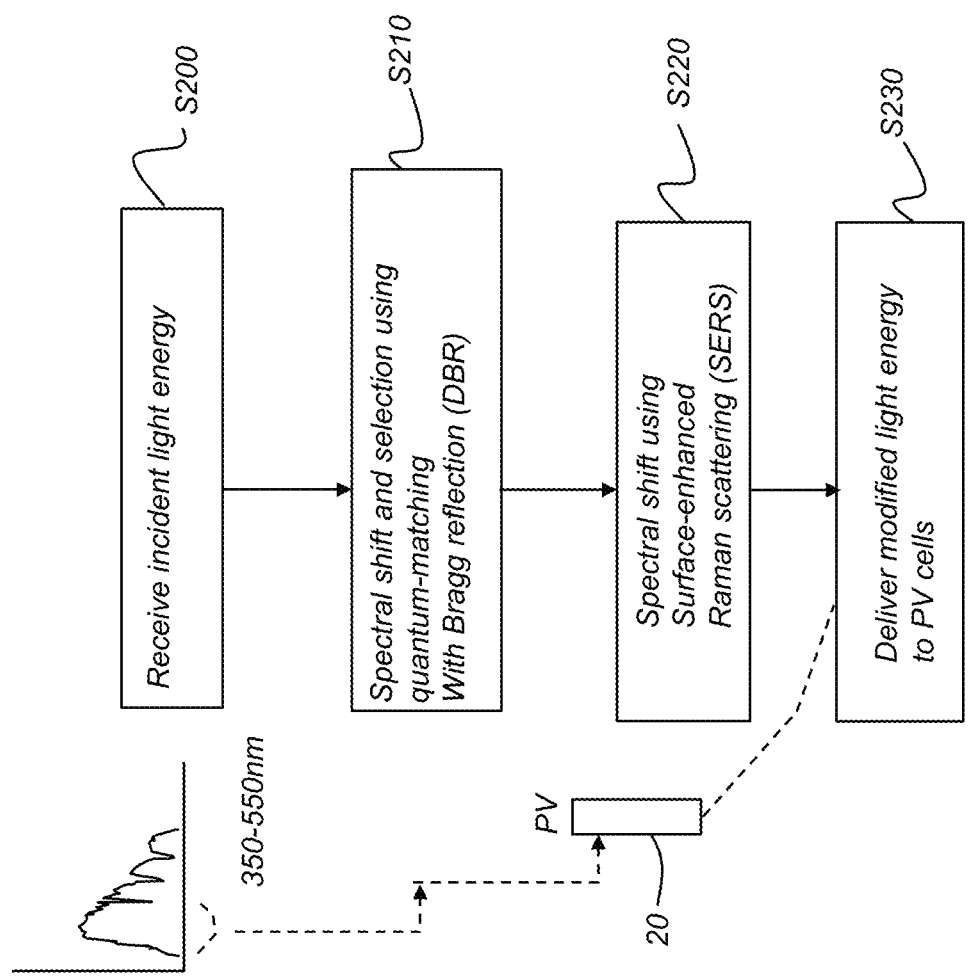
FIG. 11 is a flow diagram that shows a sequence for light handling that provides down-conversion for PV applications.

The flow diagram of FIG. 11 shows a sequence for light handling that provides down-conversion or other types of spectral shifting as executed by band pass filter/spectral conditioner 630. According to an exemplary embodiment, this sequence can be used for shifting a portion of the higher energy UV and visible light in the received sunlight radiation to the lower energy bandgap range of a conventional silicon PV cell, 1064 nm. The sequence achieved by the Applicant's coating is as follows:

(i) Step S200: Receive incident light energy. For incident sunlight, for example, most of the irradiance is within the visible region, roughly between about 450-700 nm.

(ii) Step S210: Perform spectral shift and selection using distributed Bragg reflection (DBR) with quantum confinement.

(iii) Step S220: Perform a further spectral shift using surface-enhanced Raman scattering (SERS).

(iv) Step S230: Transmit the light for energy harvesting; this includes the spectrally shifted light, such as at a PV converter 20.

As a result of photovoltaic action, electrical current is generated following step S230. The generated electrical current can be stored, such as in a battery or other storage cell, or can be directly used for obtaining electrical energy.

It should be noted that concentration of the light energy is not shown in the sequence of FIG. 11. In one embodiment, as described with reference to FIG. 6, the light energy received at step S200 has been concentrated at concentrator array 620. According to an alternate embodiment, light concentration is performed following the spectral shift, that is, between steps S220 and S230 in the FIG. 11 sequence.

Figure 12A:
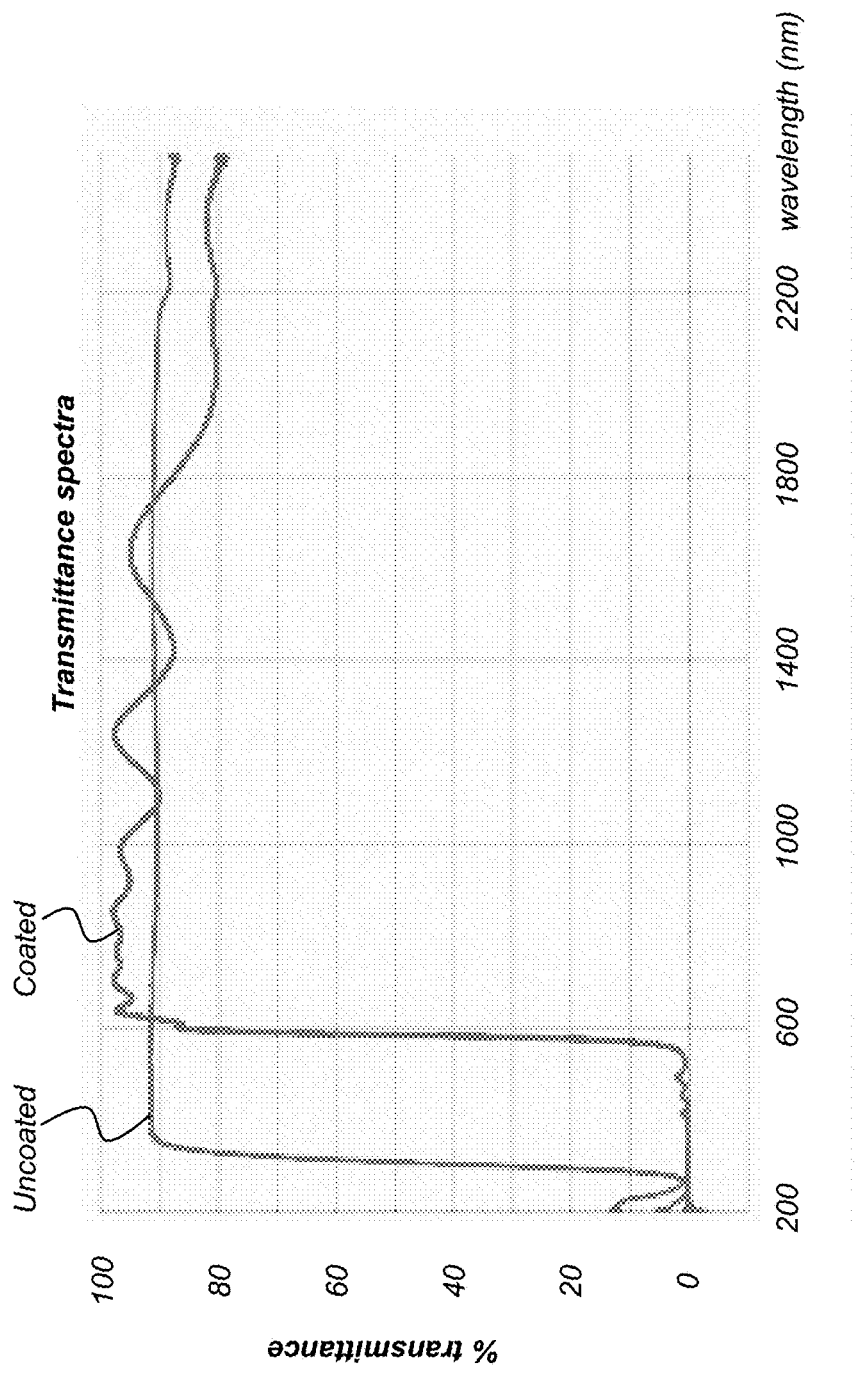
FIG. 12A is a graph that shows improved spectral response for a light-propagating material according to an embodiment of the present disclosure.
Figure 12B:
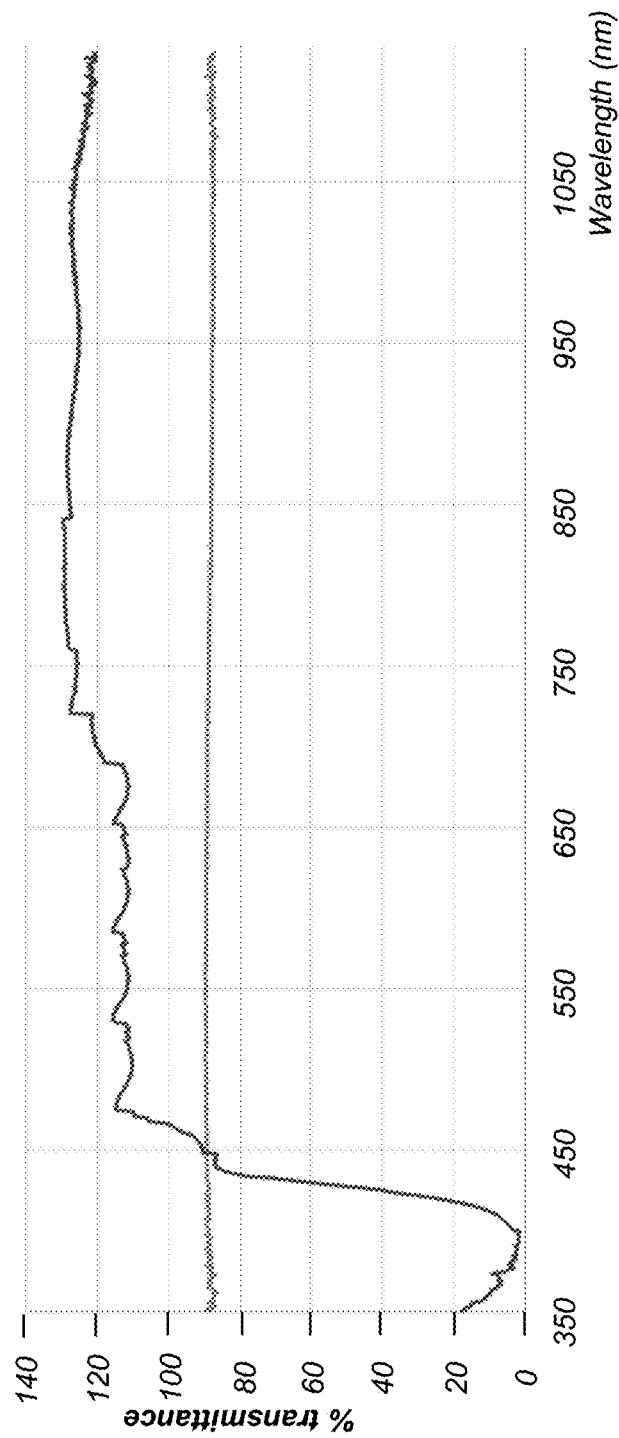
FIG. 12B is a graph that shows improved spectral response for a coated light-propagating material compared against pane glass transmission according to an embodiment of the present disclosure.

The graph of FIG. 12A compares the transmission spectra of an uncoated optical glass with the transmission spectra of the same glass material having a coating formed according to an embodiment of the present disclosure. As can be seen, the transmission efficiency is enhanced for higher wavelength light. This enhancement can be beneficial for PV applications. FIG. 12B shows improved spectral response for a coated light-propagating material used as spectral conditioner 630 compared against pane glass transmission according to an embodiment of the present disclosure.

Figure 12C:
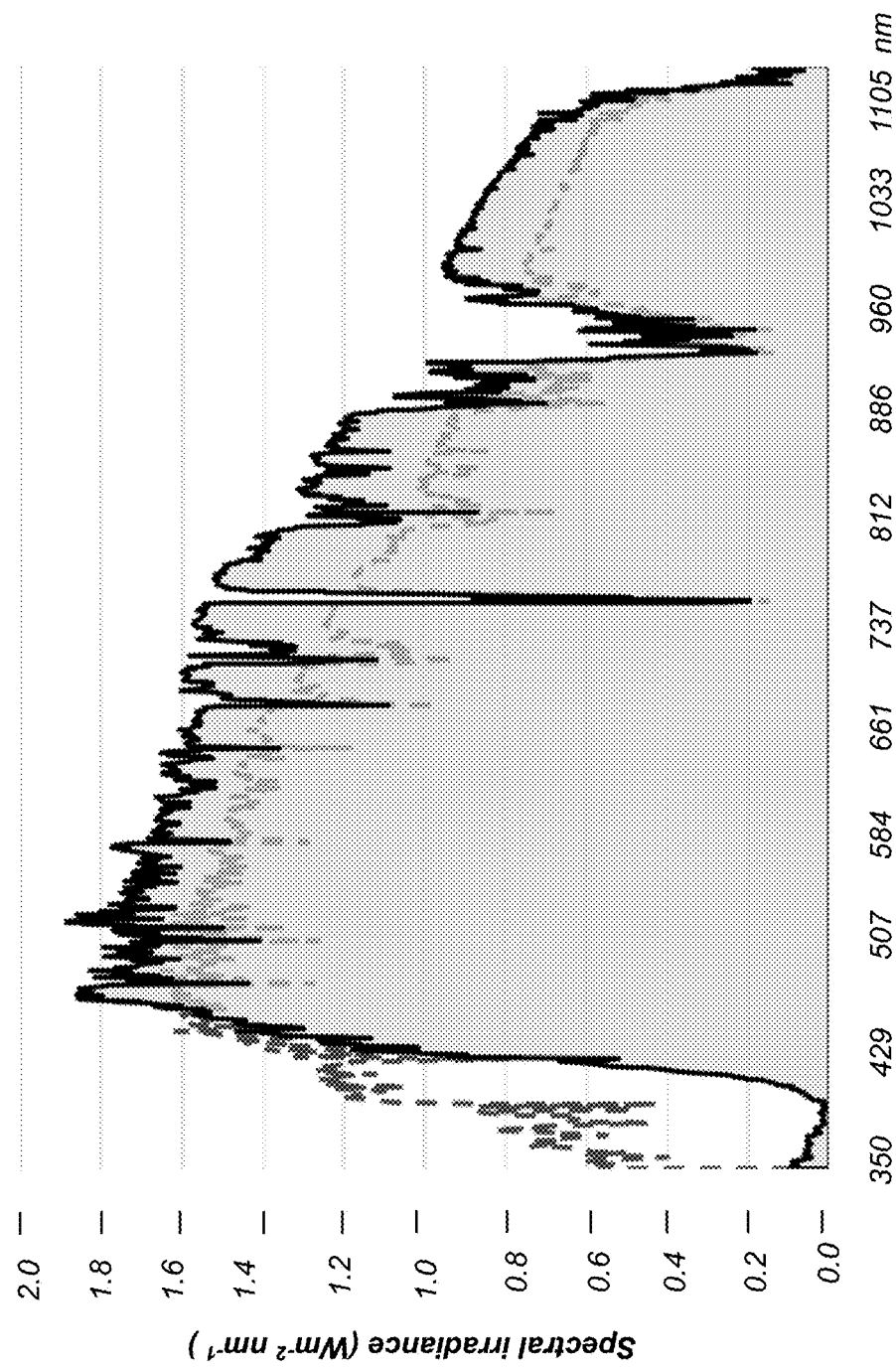
FIG. 12C is a graph that shows spectral irradiance for incident light and for light that has been spectrally shifted by propagation through the coating of the present disclosure.

The graph of FIG. 12C shows spectral irradiance for incident light in air (dashed line) and for light that has been spectrally shifted by propagation through the coating of conditioner 630 of the present disclosure (full line). Shading shows the corresponding shift in energy distribution and change in overall power density.

Figure 12D:
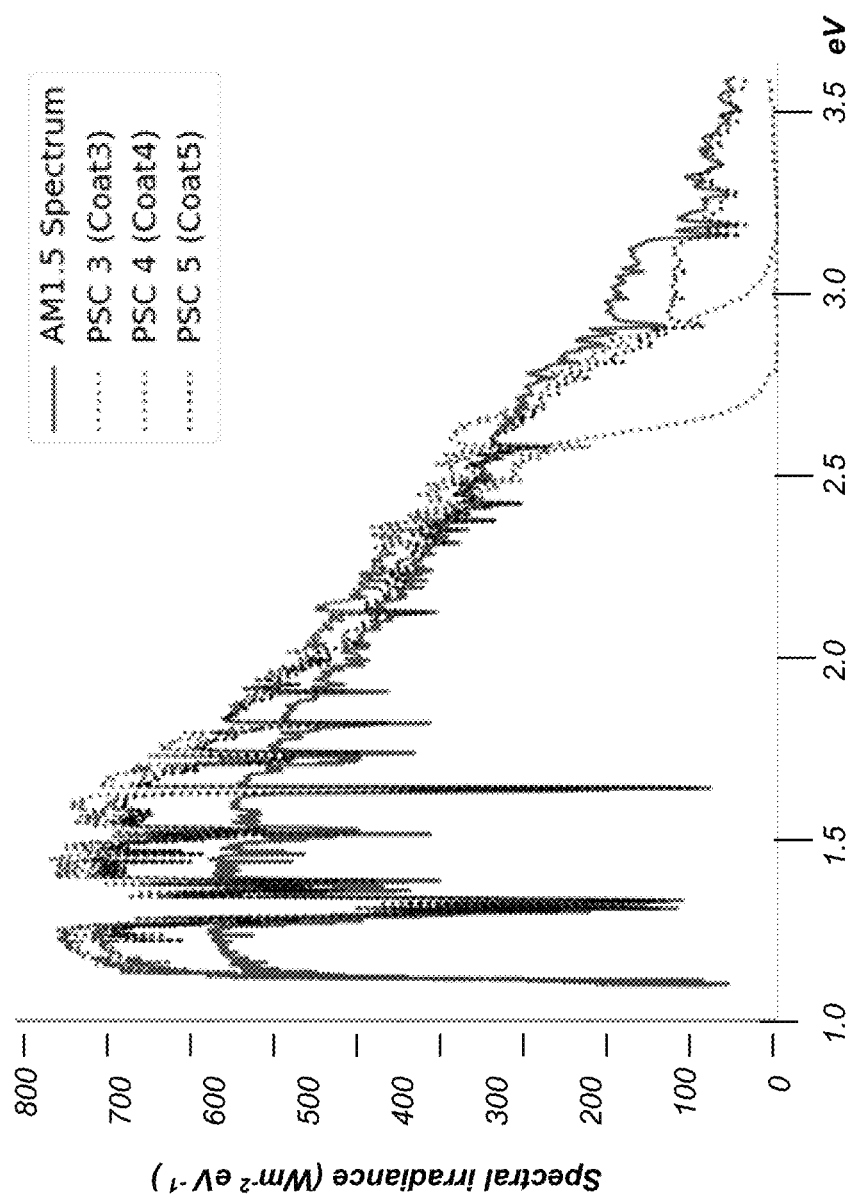
FIG. 12D is a graph that shows spectral irradiance vs. energy in eV using different coatings for spectral conversion.

FIG. 12D is a graph that shows spectral irradiance vs. energy in eV using different coatings for spectral conversion (with data labeled PSC 3, 4, 5), relative to the air mass (AM1.5) standard.

Figure 12E:
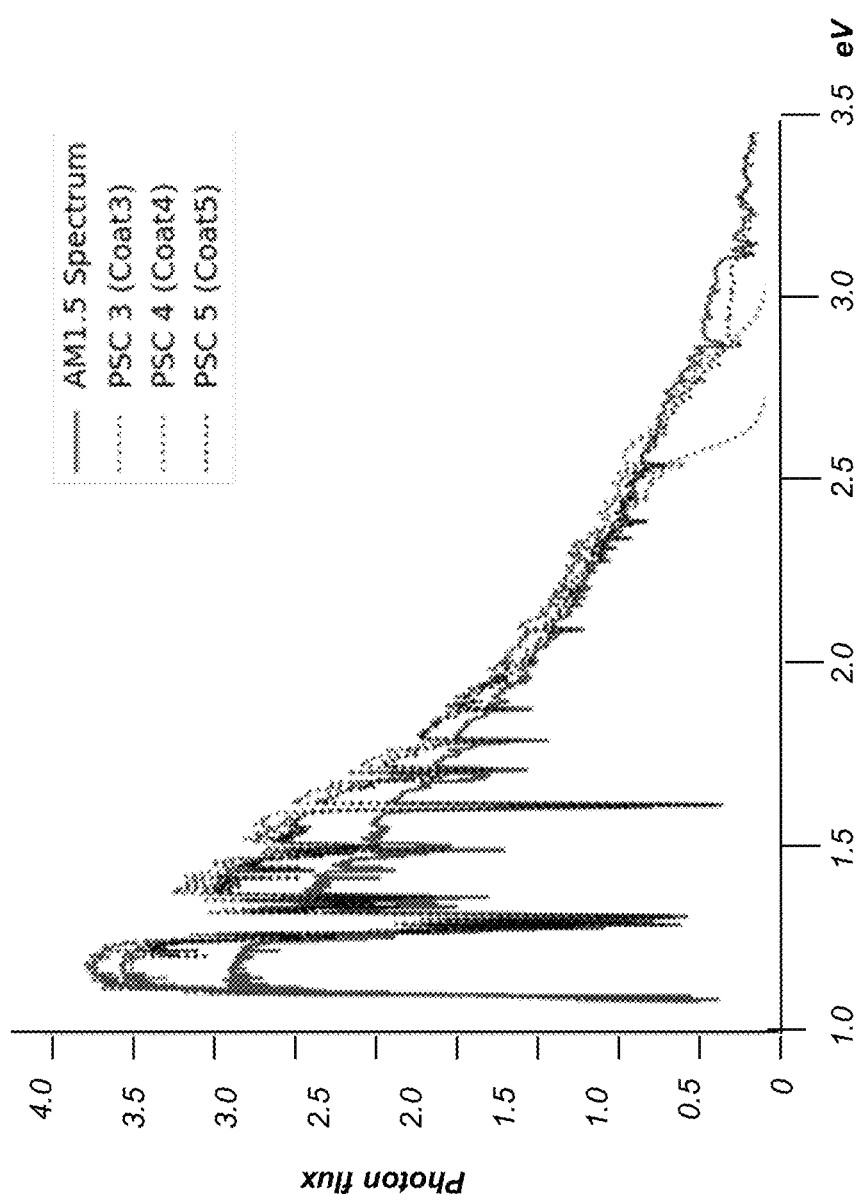
FIG. 12E is a corresponding graph showing the change in relative photo flux, measured as number of photons per second per unit area.

FIG. 12E is a corresponding graph showing the change in relative photo flux, measured as number of photons per second per unit area, relative to energy in eV.

Figure 13:
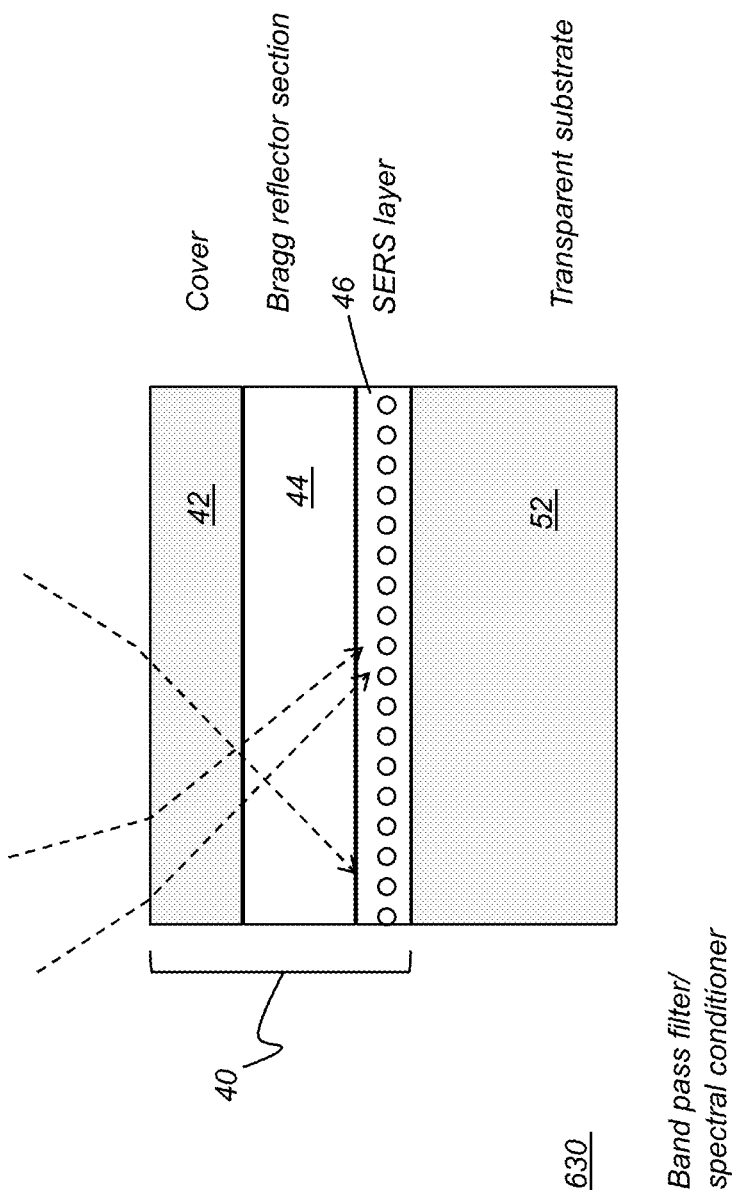
FIG. 13 is a schematic side view showing a multi-layered coating for down-conversion of light energy.

The cross-section of FIG. 13 shows, in schematic form and not to scale, the structure of band pass filter/spectral conditioner 630. Component 630 has an arrangement of layers that can be used to provide a coating 40 on a transparent substrate 52, wherein coating 40 has the described spectral behavior for down-conversion of light energy in a PV application, with the light incident from above in the orientation shown. A cover 42 is formed from a light-propagating material, typically glass or plastic. A modified distributed Bragg reflector (DBR) section 44 is a multilayer structure that provides the first spectral shift with selection noted in the FIG. 2 sequence by changing the coherence length of a portion of the incident light. The spectrally shifted light is then directed to a surface-enhanced Raman scattering (SERS) layer 46, wherein subsequent spectral shifting takes place. The resulting light energy, shifted toward the bandgap desired, such as bandgap of a PV device for example, can then be directed to a PV material or other substrate.

Structure and Composition of Bragg Reflector Section 44

Embodiments of the present disclosure use principles of Bragg reflection, modified for quantum matching, as described following. It must be noted that Bragg reflection, of itself, does not cause a spectral shift, but is rather used for selective reflection of a narrow portion of the spectrum. In order to better understand the additional shifting mechanism that is formed within the Bragg reflector structure, it is useful to first review some basic principles of Bragg reflection. The distributed Bragg reflector arrangement can alternately be considered a 1-D photonic crystal, formed as a periodic arrangement of microstructures that collectively define particular energy bands.

Figure 14:
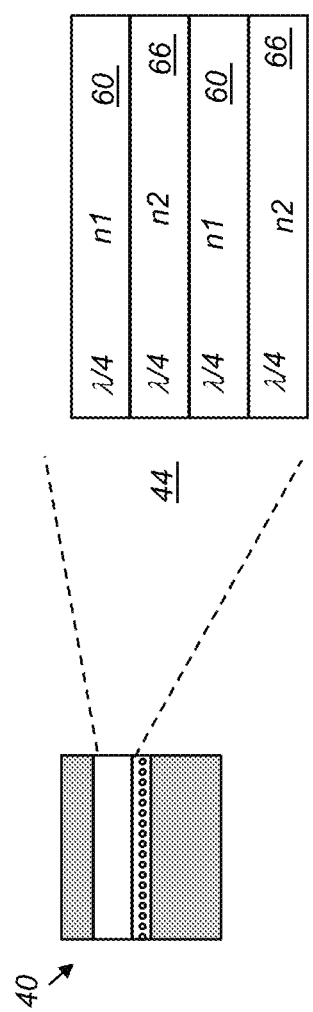
FIG. 14 is a side view schematic diagram that shows the layered arrangement for Bragg reflection used in a down-conversion coating.
Figure 15:
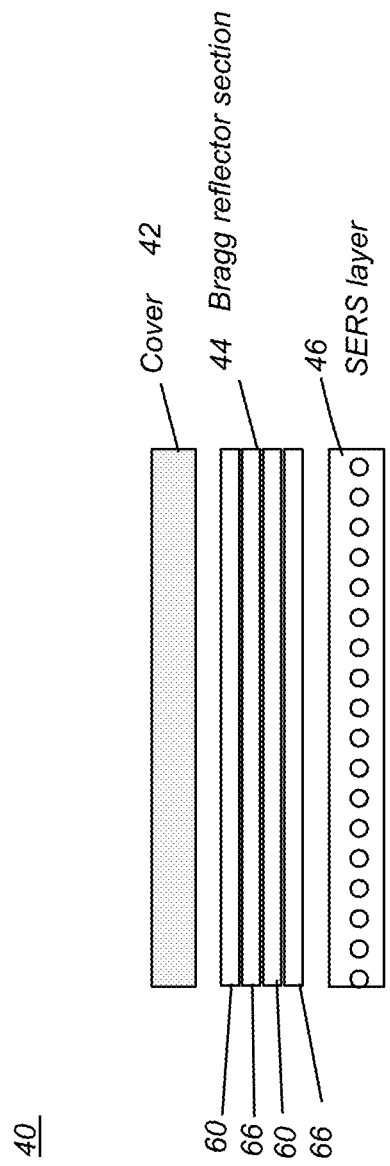
FIG. 15 is a cross-sectional, partially exploded view that shows the layered arrangement used for a transparent down-conversion (DC) film or coating that is formed according to an embodiment of the present disclosure.

The schematic side view of FIG. 14 and exploded view of FIG. 15 show an arrangement of multiple layers 60, 66 for Bragg reflector section 44 according to an embodiment. Bragg reflector section 44 is formed as a quarter-wave stack that provides a photonic crystal. A sequence of transparent layers, overlaid on one another, has alternate layers having alternating indices of refraction, with indices shown respectively as n1, n2. Four layers are shown in FIG. 1; additional layers could alternately be used for forming a Bragg reflector. According to an embodiment, 6-12 periods are used, each period having a pair of layers of alternate indices. The periodic variation in refractive index can be provided by layers having $\lambda/4$ thickness, wherein, wavelength $\lambda$ is at a suitable wavelength for the particular application. According to an exemplary embodiment of the present disclosure, the target Bragg wavelength $\lambda$ is about 600 nm.

Layer thickness, alternating slightly between values d1 and d2 for the different materials that have respective indices n1 and n2, can provide Bragg reflection at a Bragg wavelength $\lambda_B$, with the alternating thickness values given by:

$$d_1 = \frac{1}{4}\frac{\lambda_B}{n_1}$$

$$d_2 = \frac{1}{4}\frac{\lambda_B}{n_2}$$

With silicon (Si), layer thickness is typically in the 60 nm range.

The period $\Lambda$ of the Bragg layer sequencing can be expressed:

$$\Lambda = d_1 + d_2 = \frac{\lambda_B}{2}\left[\frac{1}{2n_1} + \frac{1}{2n_2}\right] \text{ or}$$

$$\Lambda = \frac{1}{2}\frac{\lambda_B}{\bar{n}} \text{ wherein } \bar{n} = \left[\frac{n_1 + n_2}{2}\right]$$

$$\text{Thus, } \frac{1}{\bar{n}} = \frac{1}{2}\left(\frac{1}{n_1} + \frac{1}{n_2}\right)$$

With a Bragg reflection wavelength:

$$\lambda_B = 2\bar{n}\Lambda_B$$

a propagation constant can be obtained:

$$\beta_B = \frac{2\pi}{\lambda_B/\bar{n}} = \frac{\pi}{\Lambda_B}$$

For light at wavelength:

$$\lambda_B: \Delta\beta = \beta - \beta_B$$

For light in phase with the grating, the difference between indices n1 and n2 is relatively small. At the Bragg wavelength, transmission loss can be exceptionally low; reflectivity at this wavelength can exceed 99.99%.

Other, more conventional proposed solutions for handling light to or within photovoltaic devices use Bragg reflectance to trap or otherwise contain the incident light, but lack the capability to provide a wavelength shift. Embodiments of the present disclosure address the problem of wavelength shifting using quantum matching in forming the distributed Bragg reflector structure. In a quantum-confined Bragg grating, the reflector arrangement maintains light energy at an antinode, for enhancement of optical gain by a factor of 2.

According to an embodiment, quantum confinement or quantum matching is achieved using a distribution of silicon (Si) nanoparticles/nanocrystals embedded within a silicon oxide (SiO2) substrate. Spaces between the distributed nanoparticles form vertical cavities within the SiO2 substrate ("vertical" extending in a direction generally orthogonal to the plane of layers and of the PV device surface). Resonance of the light signal within the cavities results in coherence of the light, at frequencies (wavelengths) that correspond to the overall distribution and vertical distance of these cavities. Thus, in quantum matching, the relative concentration and distribution of nanoparticles within each of one or more layers of the DBR structure has impact on both the index of refraction of the Si/SiO2 layer and on the range of spectral shifting that is obtained.

According to an embodiment of the present disclosure, two different layers alternate in the DBR coating 40 structure:

(i) layers 60 in the layered arrangement shown in FIG. 5 are formed of an engineered material having a distribution of Si particles within an SiO2 substrate; and (ii) alternate layers 66 are formed of another transparent, conducting material such as indium-tin oxide (ITO). Alternative materials that can also be used include various types of doped binary compounds, including aluminum-doped zinc oxide (AZO), indium-doped cadmium oxide, and aluminum, gallium, or indium-doped zinc oxide (AZO, GZO, or IZO), for example.

Materials used for providing substrate and nanoparticle components are selected for suitability for forming vertical cavities having appropriate geometry for the target wavelengths.

Structure and Composition of SERS Layer 46

Referring back to the schematic diagram of FIG. 13, SERS layer 46 forms a wavelength conversion engine that provides additional wavelength shift to the incoming light, following conveyance of the light and initial shifting of wavelength through Bragg reflector section 44.

Regarding the down-conversion of photons with scattering and Stokes shift, it has been shown that near resonant Raman scattering, given an ultraviolet (UV) or visible (VIS) excitation source such as 325 nm excitation source, gives rise to T2 (LO) peaks in the infrared (IR) energy region. Thus, for example, the 325 nm source can generate peaks within a region of interest 600 nm to 1050 nm. The intensity of the generated T2 (LO) peaks increases with ZnS nanoparticle size from 6 nm to 30 nm.

In an embodiment, the surface enhanced Raman effect causes the UV and VIS in the range of 350 nm to 450 nm to excite T2 (LO) peaks in the 600 nm to 1000 nm region as a result of Raman shift (Stokes shift). This shift may be caused by the change in bandgap energy caused by the quantum confinement and free exciton emission energy created by surface plasmons. The ZnS metal nano-particles provide the necessary plasmonic energy for the Stokes shift and hence do not cause loss in the energy of the shifted photons emitted in the region of interest.

Raman scattering is a result of formation of a dipole cloud from electrons of the molecular materials. Spectral shifting and surface enhancement of the Raman scattered signals results from the distribution of conductive nanoparticles of appropriate materials, such as silver, gold, and zinc, for example, within the substrate that forms SERS layer 46. By appropriate selection of materials and their distribution, the SERS layer 46 can be configured to exhibit localized surface plasmon resonance (LSPR) to provide spectral shifting toward a suitable wavelength range. The term "conductive" used herein refers to having a relatively low volume resistivity, e.g., without limitation, a volume resistivity that is less than $10^2$ Ohm-m at 20° C. Volume resistivity relates to the ability of a material to oppose the flow of electric current.

The SERS layer 46 provides localized surface plasmon resonance (LSPR) to provide spectral shifting to a suitable wavelength range.

Propagation of light through a medium with a sparse distribution of embedded nanocrystals can be approximated by the effective refractive index of a homogeneous medium, computed as:

$$\bar{m} = m\left[1 + i\frac{2\pi\rho}{k^3}S(0)\right]$$

wherein:
m=refractive index of the light-conveying medium in which nanoparticles are embedded;

$k = \dfrac{\omega}{c}$ wavenumber in the medium;

$\rho = \dfrac{N}{V}$ number of particles $N$ divided by the volume $V$;

S(0) scattering amplitude in the forward direction;

The absorption coefficient, wherein the absorption medium has complex refractive index is generally:

$$\alpha = 2k\, I_m \bar{m}$$

for a thin layer with small, identical nanoparticles the absorption coefficient is given by:

$$\alpha = \frac{m4\pi\rho}{k^2}$$

$$R_e S(0) = \rho m c_{ext}$$

wherein $c_{ext}$ is the extinction cross section of a single particle, proportional to the real part of the scattering amplitude $R_e\, S(0)$.

According to Beer's law, the attenuation of a collimated beam propagating through the effective medium over a distance h is obtained using:

$$I(h) = I(0)e^{-hm\rho C_{ext}}$$

wherein I is the intensity.

Wavelength shifting occurs due to interaction between competing processes, as described in the article by van Dijk et al. entitled "Competition between Extinction and Enhancement in Surface-Enhanced Raman Spectroscopy" in *Physical Chemistry Letters, American Chemical Society*, 2013. pp. 1193-1196, incorporated herein by reference. SERS operates to cause extinction of the resonant signal at plasmon frequencies for the nanoparticles, with corresponding enhancement of the Raman scattered signal at a distance from the resonant wavelength. This counter-intuitive behavior, with diminished Raman signal when nanoparticles are excited at plasmon resonance, can be adapted to provide up-conversion of the incident light to longer wavelengths, which is typically the behavior desired for PV applications. Alternately, SERS can be used to effect down-conversion of the incident light to shorter wavelengths, as well as wavelength band matching.

Among factors that can be controlled in order to adjust the wavelength and intensity of the Raman scattered light energy are nanoparticle type, shape, overall size, and concentration/distribution. Design of spectral response with SERS structures is described, for example, in an article by A. Bouali, S. Haxha, F. Abdelmalek, M. Dridi, and H. Bouchriha entitled "Tuning of Plasmonic Nanoparticle and Surface Enhanced Wavelength Shifting of a Nanosystem Sensing Using 3-D-FDTD Method" in *IEEE Journal of Quantum Electronics* Vol. 50, No. 8 (August 2014), pp. 651-657, incorporated herein by reference.

A plasmon resonant material scatters incident light over a frequency spectrum that is characteristic of the material's particle diameter, size, and dielectric attributes of the surrounding substrate. Resonantly scattered light for some materials can increase the wavelength, such as to provide a "red-shift", to incident light.

A feature of plasmon creation in a metallic particle is the generation of enhanced electric fields in the region near its surface. Interactions between this electric field and nearby materials can significantly alter both the scattering characteristics of the resonant particle and the nearby material. Surface Enhanced Raman Spectroscopy (SERS) exploits the localized plasmon resonance in particle-coated films, engineered to enhance Raman scattering by a few orders of magnitude. Using this technique, Raman scattering from the materials of interest can be observed; the local field generated by the plasmon can be used to enhance the intensity of that scattering.

According to an embodiment of the present disclosure, SERS layer 46 is formed of metallic nanoparticles formed of zinc oxide (ZnO) or other transparent, conductive metal, embedded within a transparent, conductive base material or matrix. According to an embodiment of the present disclosure, ITO is the conductive base material. A number of types of metallic nanoparticles can be used for obtaining plasmon response in SERS layer 46, depending on the amount of wavelength shifting that is required. Suitable metallic nanoparticles can include noble metals such as gold and silver, and metals with favorable qualities for low reactivity and high reflection, including cobalt, and chromium, for example. Various compounds such as zinc nitrate can alternately be used. As is known to those skilled in the quantum electronics arts, the amount of spectral shift that is provided can be engineered into the material, such as by applying a suitably designed coating. The spectral shift that is achieved can be, in part, a factor of nanoparticle size and distribution and of the complex index of refraction of the base material or matrix.

It should be noted that the use of various types of nanoparticles and control of their relative sizes and distributions within the different layers of the film or coating of the present disclosure allows adjustment of light wavelengths that enables use for up-conversion, down-conversion, or wavelength band matching.

Fabrication of Down-Conversion Film

For solar energy conversion applications, for example, the Applicant has found that a down-conversion coating or film 40 can be formed using the arrangement described previously to provide suitable wavelength shifting that conditions incident sunlight to wavelengths that are more favorable for efficient conversion by PV devices.

With respect to the layered arrangement shown in FIGS. 13-15, fabrication steps begin with cover 42, which can be a transparent glass or plastic substrate, then form the layers of the Bragg reflector section 44 onto cover 42, followed by formation of SERS layer 46.

Steps for forming coating 40 onto cover 42 as a base can use the following sequence:

(i) Form a first layer 66 using sputtering or other deposition technique to deposit 50 nm of ITO or other conductive, light-conveying material.

(ii) Sputter or otherwise deposit a thin layer of Si onto layer 66.

(iii) Use sintering or annealing to form nanocrystals from the deposited Si layer. According to an embodiment, sintering temperatures in the 600-800 degrees C. range form Si nanocrystals of suitable size and distribution for forming layer 60 with a given index of refraction that differs from that of the ITO layer and having desired nanocrystal distribution for forming vertical cavities for Bragg reflection at suitable wavelengths.

(iv) Form an embedding layer by depositing ITO or other conductive, light-conveying material onto the nanocrystals formed.

(v) repeat steps (i)-(iv) two or more times to form Bragg reflector section 44.

(vi) Form the SERS layer by applying a conductive, transparent base, such as ITO, and embedding or otherwise distributing ZnO onto the base.

(vii) Form nanoparticulate ZnO particles with suitable distribution for generating SERS.

There are a number of known methods for forming nano-optical coatings. These methods include, but are not limited to, roll coating, spin coating, physical vapor deposition, chemical vapor deposition and magnetron plasma sputtering. Roll coating has disadvantage of using a filler formed of polymer binders and fillers that degrade when exposed to sunlight.

Magnetron plasma sputtering can be used for nano-optical coatings of inorganic, long-lasting metal oxides, such as, TiO2, SiO2, MgF2, for example. This technique allows in-line processing, with the capability to sputter a large number of glass sheets within favorable cycle times. The magnetron plasma sputtering technique builds the nano-optical coating layer-by-layer, as an additive fabrication process.

Figure 16:
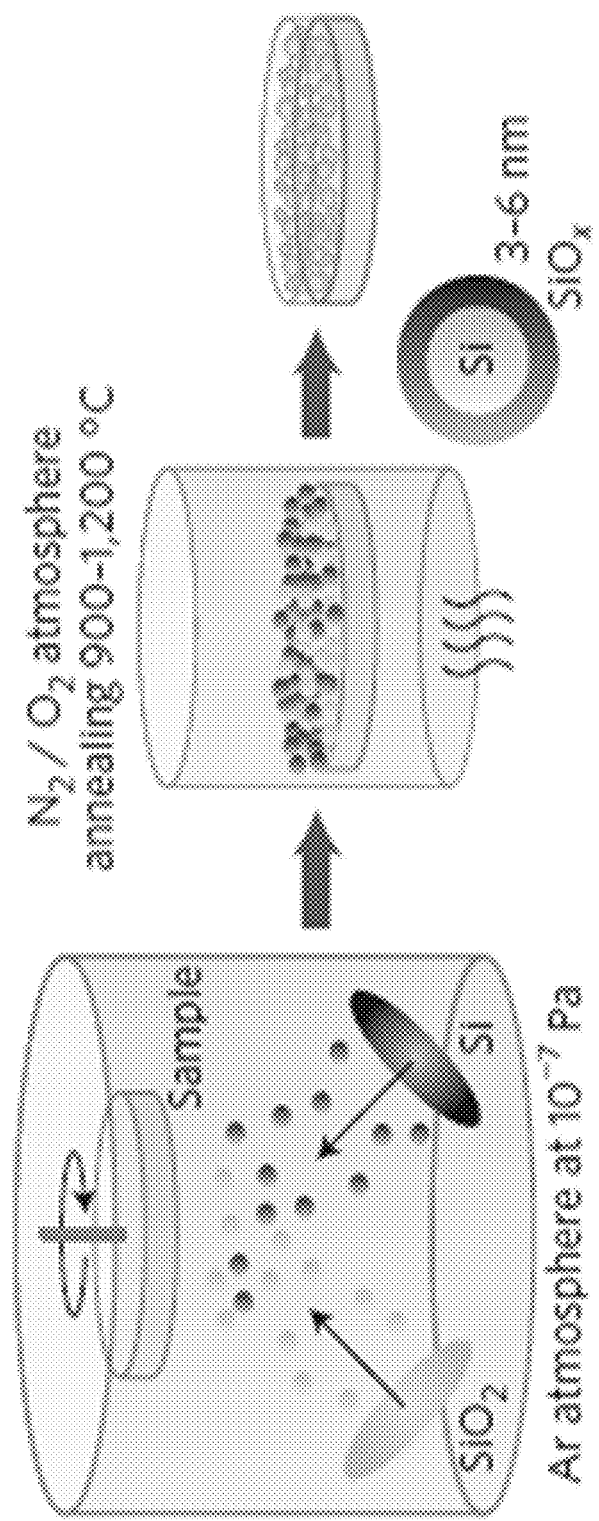
FIG. 16 shows a sequence for additive fabrication and forming in situ nanoparticles within the coating.

The diagram of FIG. 16 shows a sequence for additive fabrication and forming in situ nanoparticles within the coating. From left to right, sputtering is used to apply the material and related oxide to a substrate (at the sample position). An annealing process, under controlled conditions such as in a $N_2/O_2$ atmosphere, is then used to condition the coating to its substrate. Temperatures for annealing are typically in the 900-1200 degree C. range, without limitation. The resulting nanoparticles can be tested and used to provide the desired transmissive and reflective properties.

For nano-particle inclusion in the matrix of the transparent material, such as within Transparent Conducting Oxides (TCO), for good contact at the top and bottom surface of the single junction c-Si solar cells, thermal annealing can be obtained. Thermal annealing of the sputtered layer of metal oxide to create in-situ nanocrystals, again using an additive manufacturing process, allows improved control; applying the annealing temperature and pressure, using methods familiar to those skilled in the materials art, allows the precise control of size and density of the nanocrystal active layer.

The additive manufacturing sequence described is suitable for in-line, high throughput processing. Quartz heaters can be incorporated within the sputtering chamber. The coating can include at least one layer of fluorescent nanoparticles.

According to an embodiment, there is a sequence of steps that combines nano-particles suitably structured and embedded in metal oxides to achieve a band-pass of 700 to 1100 nm and a low percentage of the down-shifting of high-energy photons of 300 nm to 600 nm wavelength towards 800 nm to 900 nm lower-energy photons, more suitable for PV and other applications. Transmittance and reflectance spectra for the experimental coating has been validated by independent testing. Outdoor testing, for example, indicates a gain of efficiency for a 72-cell full size solar panel, with overall improvement averaging from 15% to 22% in solar panel efficiency based on field trials.

The cross-sectional view of FIG. 13 shows (not to scale) the layered arrangement used for band pass filter/spectral conditioner 630 using layers applied to a glass substrate 52. According to an embodiment, the needed layers of material can be formed and provided as a film or coating. The provided film or coating can be fabricated in rolled or sheet form, then applied to a substrate surface using an optical adhesive, such as EVA (ethylene-vinyl acetate), for example.

According to an embodiment of the present disclosure, the substrate is a low-iron solar glass, such as solar glass products manufactured by Gujarat Borosil Ltd., Gujarat, India.

Layers can be formed on the light-propagating substrate by any of a number of suitable methods, such as by physical or chemical vapor deposition. Sintering and annealing processes can be executed under high vacuum or in an oxygen-free environment, for example.

According to an alternate embodiment of the present disclosure, a layered film as shown in FIG. 13 and described herein can be formed on a film substrate for application to glass or other optical material or component. Alternately, the layers that form the filter can be formed directly onto a surface of a light-propagating material or photonic component for improved spectral efficiency and response.

Although described in an embodiment for down-conversion function, the apparatus and methods of the present disclosure can alternately be applied, with suitable changes in material distribution and size, for up-conversion, as well as for shifting of light energy to a preferred wavelength range.

Preliminary Results with Mono-Crystal Si Solar Cell

Preliminary experiments were carried out by the Applicant as proof of concept for a Photonic Solar Conversion process. Mono crystalline Si single solar cells (152×152 mm) were subjected to three comparative conditions using a dynamic test platform with one-axis tracking of the sun. The three conditions tested were:

Bare PV cell (PV)
PV cell with Fresnel concentrator (PV-C)
Photonic Solar Conversion panel with PV cell with nano photonic filter and Fresnel concentrator (PSC-SP)

The preliminary result indicates that the power generation wattage for the bare PV is the lowest power generated. The same PV cell with optical concentrator increases power generation but, due to increased temperature, reduces the power generation. The highest power generation is obtained by the combination of photonic filter with band-pass of 700 nm to 1100 nm and concentrator as shown in FIG. 6 and the graph of FIG. 9. The x-axis represents time of the observation, the y-axis represents the energy generation in Watt hours. The three conditions are graphed—output 910 represents the bare PV cell, followed by output 920 representing an arrangement of the PV cell with an optical concentrator (PVC). The output 930 graph represents the PV cell with nano-optical filter and concentrator assembly.

Power generation for PV-C configuration is initially higher than the PSC-SP but, with time, flattens out and drops lower than the PSC-SP power generation. The FIG. 10 compares the three configurations conducted over three days and, for longer term data measurement, over seven days.

FIG. 9 indicates gain by the PV-C and PSC-SP indicates that PSC-SP panels with photonic filter and concentrator is consistently higher than both PV and PVC with concentrator. The higher gains in energy generation can be attributed to the conditioning of photons with wavelengths close to the Si p-n junction bandgap, and abundance of the wavelengths close to optimum absorption wavelength of 850 nm. The percentage gain for the PVC/PV averages nearly 100% but decreases significantly with the increase in temperatures of the solar cells. The percentage gain for single PV cell with PSC-SP configuration is close to 200% on average and remains consistent, as the solar cell temperature does not increase, even with 5× concentration. This preliminary data on three configurations shows the efficacy of the proposed apparatus.

The chart of FIG. 17 shows exemplary data for various coatings used for spectral conversion, according to an embodiment of the present disclosure.

According to an embodiment of the present disclosure, an optical coating has a set of layers formed to reflect a predetermined range of wavelengths, the set of layers including two or more pairs of alternating first and second layers, the first layers having a first refractive index, $n_1$, and the second layers having a second refractive index, $n_2$, greater than the first refractive index $n_1$, wherein the second layers each include a first distribution of nanoparticles of a first material, wherein the layers exhibit a spectral characteristic that shifts a portion of the incident light wavelengths to a first range of wavelengths and that directs light of the first range of wavelengths to a surface-enhanced Raman scattering layer. The surface-enhanced Raman scattering layer is configured with a second distribution of conductive nanoparticles of a second material to further shift the light of the first range of wavelengths to a second range of wavelengths different from the first range, according to the second distribution of nanoparticles in the Raman scattering layer. The spectral characteristic of the layers can be provided by reflective cavities formed within the first distribution of nanoparticles. The first material can be silicon; the second material can be a conductive metal. The coating can be formed as a film.

An optical coating in accordance with an embodiment of the present disclosure can have a distributed Bragg reflector section that is configured to reflect a target wavelength; and a surface-enhanced Raman scattering section that is adjacent to the DBR section and is configured to accept light of the target wavelength from the DBR section and generate light that is spectrally shifted from the received light.

According to an embodiment of the present disclosure, there is provided an apparatus for solar energy power conversion comprising: a planar array of light concentrators distributed in a pattern, for example, a honeycomb pattern or a row-column pattern; a planar array of PV cells distributed in light-path alignment with the light concentrators; and a spectral converter that extends between the planar array of light concentrators and the planar array of PV cells, wherein the spectral converter is configured to convert incident light of a first spectral distribution from the array of light concentrators to outgoing light of a second spectral distribution for the array of PV cells.

The spectral converter can comprise a coated glass sheet. The coating can be formed of two or more layers of metal oxide. Light concentrators can be Fresnel lenses. The second spectral distribution can have increased light energy over a spectral range associated with a band gap of the PV cells. There can be an encapsulating casing.

According to an embodiment of the present disclosure, an apparatus for retrofit to a photovoltaic cell array for solar power conversion comprises: a planar array of light concentrators distributed in a pattern corresponding to the photovoltaic cell array; a spectral converter that extends between the planar array of light concentrators and the PV cell array, wherein the spectral converter is configured to convert incident light of a first spectral distribution from the array of light concentrators to outgoing light of a second spectral distribution for the PV cells. The Fresnel lens can be made from any transparent polycarbonate material or group of polycarbonate materials, for example.

According to an embodiment, the optical coating can generate photon energy at multiple wavelengths. A glass substrate may or may not have an anti-reflection coating.

The invention has been described in detail, and may have been described with particular reference to a suitable or presently preferred embodiment, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced therein.

The invention claimed is:

1. An apparatus for retrofit to a photovoltaic cell array for solar power conversion comprising:
   a planar array of light concentrators distributed in light-path alignment with the photovoltaic cell array, wherein each cell in the photovoltaic cell array receives light that has been directed through at least one corresponding light concentrator of the planar array of light concentrators; and
   a spectral converter that extends between the planar array of light concentrators and the photovoltaic cell array,
   wherein the spectral converter is configured to convert incident light of a first spectral distribution and received from the planar array of light concentrators to outgoing light of a second spectral distribution and to direct the outgoing light along the alignment light path toward the photovoltaic cells array, wherein the second spectral distribution has higher spectral irradiance at longer wavelengths than the first spectral distribution, and wherein the spectral converter comprises:
   a set of layers formed to convert the incident light of the first spectral distribution to an adjusted spectral distribution,
   wherein the set of layers has two or more pairs of alternating first and second layers, the first layers having a first refractive index, $n_1$, and the second layers having a second refractive index, $n_2$, greater than the first refractive index $n_1$,
   wherein the second layers each include a first distribution of nanoparticles of a first material, disposed to form resonant cavities for enhanced light coherence; and
   a surface-enhanced Raman scattering layer having a second distribution of nanoparticles of a second material, disposed to generate, at predetermined wavelengths, a localized plasmonic response that converts received light energy of the adjusted spectral distribution to the second spectral distribution.

2. The apparatus of claim 1 wherein the planar array of light concentrators comprises one or more Fresnel lenses.

3. The apparatus of claim 2 wherein the one or more Fresnel lenses are made from polycarbonate material.

4. The apparatus of claim 1 wherein the planar array of light concentrators comprises a gradient index lens array.

5. The apparatus of claim 1 wherein, compared to the first spectral distribution, the second spectral distribution has increased light energy over a spectral range associated with a band gap of the photovoltaic cells in the photovoltaic cell array.

6. The apparatus of claim 1 wherein the photovoltaic cell array has an encapsulating casing.

7. The apparatus of claim 1 wherein distances between two or more of the planar array of light concentrators, the spectral converter, and the photovoltaic cell array are adjustable.

8. An apparatus for solar power conversion comprising:
   a planar array of light concentrators distributed in light-path alignment with a photovoltaic cell array, wherein each cell in the photovoltaic cell array receives light that has been directed through at least one corresponding light concentrator of the planar array of light concentrators; and
   a spectral converter that extends between the planar array of light concentrators and the photovoltaic cell array,
   wherein the spectral converter is configured to convert incident light of a first spectral distribution and received from the planar array of light concentrators to outgoing light of a second spectral distribution and to direct the outgoing light along the alignment light path toward the photovoltaic cells array, wherein the second spectral distribution has higher spectral irradiance at longer wavelengths than the first spectral distribution, and wherein the spectral converter comprises:
   a distributed Bragg reflector with quantum confinement configured to convert incident light of the first spectral distribution to an adjusted spectral distribution having increased coherence; and
   a surface-enhanced Raman scattering layer adjacent to the distributed Bragg reflector and having a second distribution of nanoparticles of a second material distributed to exhibit localized surface plasmon resonance at a first wavelength with enhanced Raman scattering at one or more wavelengths outside of the first wavelength.

9. The apparatus of claim 8 wherein the planar array of light concentrators comprises one or more Fresnel lenses.

10. The apparatus of claim 9 wherein the one or more Fresnel lenses are made from polycarbonate material.

11. The apparatus of claim 8 wherein the planar array of light concentrators comprises a gradient index lens array.

* * * * *